(12) United States Patent
Gandikota et al.

(10) Patent No.: US 7,691,442 B2
(45) Date of Patent: *Apr. 6, 2010

(54) RUTHENIUM OR COBALT AS AN UNDERLAYER FOR TUNGSTEN FILM DEPOSITION

(75) Inventors: Srinivas Gandikota, Santa Clara, CA (US); Madhu Moorthy, Santa Clara, CA (US); Amit Khandelwal, Santa Clara, CA (US); Avgerinos V. Gelatos, Redwood City, CA (US); Mei Chang, Saratoga, CA (US); Kavita Shah, Mountain View, CA (US); Seshadri Ganguli, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/197,049

(22) Filed: Aug. 22, 2008

(65) Prior Publication Data

US 2009/0142474 A1 Jun. 4, 2009

Related U.S. Application Data

(63) Continuation of application No. 11/009,331, filed on Dec. 10, 2004, now Pat. No. 7,429,402.

(51) Int. Cl.
*B32B 15/00* (2006.01)
*B32B 15/01* (2006.01)
*C23C 16/06* (2006.01)

(52) U.S. Cl. .............. 427/248.1; 427/250; 427/255.25; 427/255.28; 427/255.7; 428/655; 428/661; 428/668; 428/670

(58) Field of Classification Search .................. 428/655, 428/661, 668, 670; 427/248.1, 250, 255.23, 427/255.25, 255.28, 255.7
See application file for complete search history.

(56) References Cited

U.S. PATENT DOCUMENTS 5,028,565 A * 7/1991 Chang et al. ................ 438/654

(Continued)

FOREIGN PATENT DOCUMENTS

EP 1293509 A3 5/2004

(Continued)

OTHER PUBLICATIONS

Aaltonen "Atomic Layer Deposition of Noble Metal Thin Films," Academic Dissertation presented at the Department of Chemistry of the University of Helsinki on Apr. 8, 2005, Helsinki, Finland, pp. 1-71.

(Continued)

*Primary Examiner*—H. (Holly) T Le
(74) *Attorney, Agent, or Firm*—Patterson & Sheridan, LLP

(57) ABSTRACT

Embodiments of the invention provide a method for depositing materials on substrates. In one embodiment, the method includes depositing a barrier layer containing tantalum or titanium on a substrate, depositing a ruthenium layer or a cobalt layer on the barrier layer, and depositing a tungsten bulk layer thereover. In some examples, the barrier layer may contain tantalum nitride deposited by an atomic layer deposition (ALD) process, the tungsten bulk layer may be deposited by a chemical vapor deposition (CVD) process, and the ruthenium or cobalt layer may be deposited by an ALD process. The ruthenium or cobalt layer may be exposed to a soak compound, such as hydrogen, diborane, silane, or disilane, during a soak process prior to depositing the tungsten bulk layer. In some examples, a tungsten nucleation layer may be deposited on the ruthenium or cobalt layer, such as by ALD, prior to depositing the tungsten bulk layer.

25 Claims, 10 Drawing Sheets

U.S. PATENT DOCUMENTS

| | | | |
|---|---|---|---|
| 5,372,849 A | 12/1994 | McCormick et al. | |
| 5,962,716 A | 10/1999 | Uhlenbrock et al. | |
| 6,063,705 A | 5/2000 | Vaartstra | |
| 6,074,945 A | 6/2000 | Vaartstra et al. | |
| 6,114,557 A | 9/2000 | Uhlenbrock et al. | |
| 6,203,613 B1 | 3/2001 | Gates et al. | |
| 6,294,836 B1 | 9/2001 | Paranjpe et al. | |
| 6,338,991 B1 | 1/2002 | Zhang et al. | |
| 6,346,477 B1 | 2/2002 | Kaloyeros et al. | |
| 6,365,502 B1 | 4/2002 | Paranjpe et al. | |
| 6,423,619 B1 | 7/2002 | Grant et al. | |
| 6,440,495 B1 | 8/2002 | Wade et al. | |
| 6,444,263 B1 | 9/2002 | Paranjpe et al. | |
| 6,462,367 B2 | 10/2002 | Marsh et al. | |
| 6,479,100 B2 | 11/2002 | Jin et al. | |
| 6,482,740 B2 | 11/2002 | Soininen et al. | |
| 6,517,616 B2 | 2/2003 | Marsh et al. | |
| 6,527,855 B2 | 3/2003 | DelaRosa et al. | |
| 6,541,067 B1 | 4/2003 | Marsh et al. | |
| 6,576,778 B1 | 6/2003 | Uhlenbrock et al. | |
| 6,580,111 B2 | 6/2003 | Kim et al. | |
| 6,596,602 B2 | 7/2003 | Iizuka et al. | |
| 6,605,735 B2 | 8/2003 | Kawano et al. | |
| 6,610,568 B2 | 8/2003 | Marsh et al. | |
| 6,617,634 B2 | 9/2003 | Marsh et al. | |
| 6,627,995 B2 | 9/2003 | Paranjpe et al. | |
| 6,635,965 B1 * | 10/2003 | Lee et al. | 257/758 |
| 6,645,847 B2 | 11/2003 | Paranjpe et al. | |
| 6,713,373 B1 | 3/2004 | Omstead | |
| 6,737,317 B2 | 5/2004 | Marsh et al. | |
| 6,740,585 B2 | 5/2004 | Yoon et al. | |
| 6,743,739 B2 | 6/2004 | Shimamoto et al. | |
| 6,744,138 B2 | 6/2004 | Marsh | |
| 6,780,758 B1 | 8/2004 | Derderian et al. | |
| 6,790,773 B1 | 9/2004 | Drewery et al. | |
| 6,797,340 B2 * | 9/2004 | Fang et al. | 427/585 |
| 6,800,542 B2 | 10/2004 | Kim et al. | |
| 6,800,937 B2 | 10/2004 | Marsh et al. | |
| 6,812,126 B1 | 11/2004 | Paranjpe et al. | |
| 6,824,816 B2 | 11/2004 | Aaltonen et al. | |
| 6,861,356 B2 | 3/2005 | Matsuse et al. | |
| 6,887,795 B2 | 5/2005 | Soininen et al. | |
| 6,893,915 B2 | 5/2005 | Park et al. | |
| 6,936,528 B2 | 8/2005 | Koo et al. | |
| 7,014,709 B1 * | 3/2006 | Fair | 117/89 |
| 7,094,680 B2 * | 8/2006 | Seutter et al. | 438/618 |
| 7,264,846 B2 * | 9/2007 | Chang et al. | 427/248.1 |
| 7,265,048 B2 | 9/2007 | Chung et al. | |
| 7,404,985 B2 * | 7/2008 | Chang et al. | 427/248.1 |
| 7,405,158 B2 * | 7/2008 | Lai et al. | 438/680 |
| 7,429,402 B2 * | 9/2008 | Gandikota et al. | 427/248.1 |
| 7,446,032 B2 | 11/2008 | Kailasam | |
| 7,473,634 B2 | 1/2009 | Suzuki | |
| 7,504,725 B2 * | 3/2009 | Kim et al. | 257/751 |
| 7,585,762 B2 * | 9/2009 | Shah et al. | 438/627 |
| 2001/0006838 A1 | 7/2001 | Won et al. | |
| 2001/0054730 A1 | 12/2001 | Kim et al. | |
| 2002/0000587 A1 | 1/2002 | Kim et al. | |
| 2002/0004293 A1 | 1/2002 | Soininen et al. | |
| 2002/0025627 A1 | 2/2002 | Marsh et al. | |
| 2002/0028556 A1 | 3/2002 | Marsh et al. | |
| 2002/0074577 A1 | 6/2002 | Marsh et al. | |
| 2002/0076837 A1 | 6/2002 | Hujanen et al. | |
| 2002/0076881 A1 | 6/2002 | Marsh et al. | |
| 2002/0081381 A1 | 6/2002 | DelaRosa et al. | |
| 2002/0102810 A1 | 8/2002 | Iizuka et al. | |
| 2002/0121697 A1 | 9/2002 | Marsh | |
| 2002/0125516 A1 | 9/2002 | Marsh et al. | |
| 2002/0173054 A1 | 11/2002 | Kim | |
| 2002/0197856 A1 | 12/2002 | Matsuse et al. | |
| 2003/0022487 A1 | 1/2003 | Yoon et al. | |
| 2003/0029715 A1 | 2/2003 | Yu et al. | |
| 2003/0096468 A1 | 5/2003 | Soininen et al. | |
| 2003/0165615 A1 | 9/2003 | Aaltonen et al. | |
| 2003/0212285 A1 | 11/2003 | Uhlenbrock et al. | |
| 2004/0005753 A1 | 1/2004 | Kostamo et al. | |
| 2004/0038529 A1 | 2/2004 | Soininen et al. | |
| 2004/0077158 A1 | 4/2004 | Um et al. | |
| 2004/0105934 A1 | 6/2004 | Chang et al. | |
| 2004/0203233 A1 | 10/2004 | Kang et al. | |
| 2004/0211665 A1 | 10/2004 | Yoon et al. | |
| 2004/0214354 A1 | 10/2004 | Marsh et al. | |
| 2004/0241321 A1 | 12/2004 | Ganguli et al. | |
| 2005/0006799 A1 | 1/2005 | Gregg et al. | |
| 2005/0081882 A1 | 4/2005 | Greer et al. | |
| 2005/0085031 A1 | 4/2005 | Lopatin et al. | |
| 2005/0124154 A1 | 6/2005 | Park et al. | |
| 2005/0196960 A1 | 9/2005 | Koo et al. | |
| 2005/0220998 A1 | 10/2005 | Chang et al. | |
| 2005/0238808 A1 | 10/2005 | Gatineau et al. | |
| 2006/0019494 A1 | 1/2006 | Cao et al. | |
| 2006/0128150 A1 | 6/2006 | Gandikota et al. | |
| 2006/0153973 A1 | 7/2006 | Chang et al. | |
| 2006/0199372 A1 | 9/2006 | Chung et al. | |
| 2006/0276020 A1 | 12/2006 | Yoon et al. | |
| 2007/0054487 A1 | 3/2007 | Ma et al. | |
| 2007/0077750 A1 | 4/2007 | Ma et al. | |
| 2007/0099422 A1 | 5/2007 | Wijekoon et al. | |
| 2007/0119370 A1 | 5/2007 | Ma et al. | |
| 2007/0119371 A1 | 5/2007 | Ma et al. | |
| 2007/0128862 A1 | 6/2007 | Ma et al. | |
| 2007/0128863 A1 | 6/2007 | Ma et al. | |
| 2007/0128864 A1 | 6/2007 | Ma et al. | |
| 2007/0202254 A1 | 8/2007 | Ganguli et al. | |
| 2007/0235059 A1 | 10/2007 | Chu et al. | |
| 2008/0135914 A1 | 6/2008 | Krishna et al. | |
| 2008/0268635 A1 | 10/2008 | Yu et al. | |
| 2008/0274279 A1 | 11/2008 | Chang et al. | |
| 2009/0004850 A1 | 1/2009 | Ganguli et al. | |

FOREIGN PATENT DOCUMENTS

| | | |
|---|---|---|
| JP | 2001111000 | 4/2001 |
| JP | 2001237400 | 8/2001 |
| WO | WO-0188972 | 11/2001 |
| WO | WO-03056612 | 7/2003 |
| WO | WO-2005020317 | 3/2005 |

OTHER PUBLICATIONS

Aaltonen, et al. "Atomic Layer Deposition of Ruthenium Thin Films from Ru(thd)$_3$ and Oxygen," Chem. Vap. Deposition (2004), 10, No. 4, pp. 215-219.

Aaltonen, et al. "Ruthenium Thin Films Grown by Atomic Layer Deposition," Chem. Vap. Deposition (2003), 9, No. 1, pp. 45-49.

Aoyama, et al. "Ruthenium Films Prepared by Liquid Source Chemical Vapor Deposition Using Bis-(ethylcyclopentadienyl)ruthenium," Jpn. J. Appl. Phys. vol. 38 (1999), pp. L1134-L1136.

Dadgar, et al. "Growth of Ru doped semi-insulating InP by low pressure metalorganic chemical vapor deposition," Journal of Crystal Growth 195 (1998), pp. 69-73.

Dadgar, et al. "Ruthenium: A superior compensator of InP," Applied Physics Letters, vol. 73, No. 26, Dec. 28, 1998, American Institute of Physics, pp. 3878-3880.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606-1608.

Dormans, et al. "OMCVD of cobalt and cobalt silicide," Journal of Crystal Growth 114, (1991), Elsevier Publishers B.V., pp. 364-372.

Froment, et al. "Nickel vs. Cobalt silicide integration for sub-50-nm CMOS," European Solid-State Device Research, 2003. ESSDERC '03. 33$^{rd}$ Conference on Sep. 16-18, 2003, pp. 215-218.

Goswami, et al. Transition Metals Show Promise as Copper Barriers, Semiconductor International, ATMI, San Jose—May 1, 2004.

Kim, et al. "Investigation of Chemical Vapor Deposition (CVD)—Derived Cobalt Silicidation for the Improvement of Contact Resistance," Japanese Journal of Applied Physics, vol. 44, No. 6A, 2005, pp. 3828-3831.

Kwon, et al. "Atomic Layer Deposition of Ruthenium Thin Films for Copper Glue Layer," Journal of the Electrochemical Society, 151 (2) (2004), pp. G109-G112.

Kwon, et al. "PEALD of a Ruthenium Adhesion Layer for Copper Interconnects," Journal of the Electrochemical Society, 151 (12) (2004), pp. C753-C756.

Kwon, et al. "Plasma-Enhanced Atomic Layer Deposition of Ruthenium Thin Films," Electrochemical and Solid-State Letters, 7 (4) (2004), pp. C46-C48.

Lashdaf, et al. "Deposition of palladium and ruthenium β-diketonates on alumina and silica supports in gas and liquid phase," Applied Catalysis A: General 241 (2003), pp. 51-63.

Lavoie, et al. "Effects of Alloying Elements on Cobalt Silicide Formation," NSLS Activity Report, Science Highlights, 2001, pp. 2-16-2-20.

Lavoie, et al. "Nickel silicide technology," Silicide Technol. Intergr. Circuits, 2004, pp. 95-151.

Lim, et al. "Atomic layer deposition of transition metals," Nature Materials, vol. 2, Nov. 2003, pp. 749-754.

Meda, et al. "Chemical Vapor Deposition of Ruthenium Dioxide Thin Films From Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Shibutami, et al. "A Novel Ruthenium Precursor for MOCVD without Seed Ruthenium Layer," TOSOH Research & Technology Review, vol. 47 (2003), pp. 61-64.

Sun, et al. "Properties of Ru Thin Films Fabricated on TiN by Metal-Organic Chemical Vapor Deposition," Japanese Journal of Applied Physics, vol. 43, No. 4A, 2004, The Japan Society of Applied Physics, pp. 1566-1570.

Yun, et al. "Highly Scalable PVD/CVD-Cobalt Bilayer Salicidation Technology for sub-50nm CMOSFETs," 207$^{th}$ ECS Meeting—Quebec City, Canada, May 15-20, 2005.

* cited by examiner

RUTHENIUM OR COBALT AS AN UNDERLAYER FOR TUNGSTEN FILM DEPOSITION

CROSS-REFERENCE TO RELATED APPLICATIONS

This application is a continuation of U.S. Ser. No. 11/009,331 (APPM/009205), filed Dec. 10, 2004, now U.S. Pat. No. 7,429,402 which is herein incorporated by reference in its entirety.

BACKGROUND OF THE INVENTION

1. Field of the Invention

Embodiments of the invention generally relate to methods for barrier layer, ruthenium layer and tungsten layer formation and, more particularly to ruthenium deposition processes for use in tungsten integration.

2. Description of the Related Art

Sub-quarter micron multilevel metallization is one of the key technologies for the next generation of very large scale integration (VLSI). The multilevel interconnects that lie at the heart of this technology possess high aspect ratio features, including contacts, vias, lines, or other apertures. Reliable formation of these features is very important to the success of VLSI and to the continued effort to increase quality and circuit density on individual substrates. Therefore, there is a great amount of ongoing effort being directed to the formation of void-free features having high aspect ratios of 10:1 (height:width) or greater.

Tungsten, replacing copper and aluminum, has recently become a choice metal for filling VLSI features, such as sub-micron high aspect ratio, interconnect features. However, tungsten has a propensity to disjoin from dielectric materials, such as polysilicon, silicon germanium and silicon oxides. The disjoining may minimally cause an increase in the contact resistance of the circuit if not cause complete failure of the electronic device. Adhesion layers or barrier layers are, therefore, deposited prior to tungsten metallization to prevent or impede the disjoining of the tungsten material on the substrate surface.

A typical sequence for forming an interconnect includes depositing one or more non-conductive layers, etching at least one of the layer(s) to form one or more features therein, depositing a barrier layer in the feature(s) and depositing one or more conductive layers, such as tungsten, to fill the feature. The barrier layer typically includes a refractory metal nitride and/or silicide, such as titanium or tantalum. Of this group, tantalum nitride is one of the most desirable materials for use as an adhesion/barrier layer because it has one of the lowest resistivities of the metal nitrides and makes a strong adhesion layer for tungsten metallization. A metal nitride layer, such as tantalum nitride, is typically deposited using conventional deposition techniques, such as physical vapor deposition (PVD) and chemical vapor deposition (CVD).

Conventional deposition processes have difficulty forming interconnect structures because these processes have problems filling sub-micron structures where the aspect ratio exceeds 4:1, and particularly where the aspect ratio exceeds 10:1. Often, the barrier layer bridges the opening of a narrow feature, resulting in the formation of one or more voids or discontinuities within the feature. Since voids increase the resistance and reduce the electromigration resistance of the feature, features having voids make poor and unreliable electrical contacts. Some processes have been developed to deposit barrier layers by atomic layer deposition (ALD), but tantalum nitride layers deposited by ALD are not commonly found in electronic devices. The lack of commercialization of tantalum nitride deposition by ALD is probably due to the additional cost of hardware and integration of the chamber into existing process platforms.

Alternatively, a thin film of a noble metal such as, ruthenium, palladium, platinum, cobalt, nickel and rhodium, among others may be used as a barrier layer or an underlayer for the metal-filled vias and lines. Usually these noble metal underlayers are deposited as barrier layers on dielectric materials for copper seed. However, ALD processes to deposit noble metals remain scarce in the art relative to transition metal ALD processes, such as to deposit titanium, tungsten or tantalum.

Therefore, a need exists, for a method to deposit an adhesion/barrier layer and tungsten in high aspect ratio interconnect features having good step coverage, strong adhesion and low electrical resistivity.

SUMMARY OF THE INVENTION

In one example, a method for depositing a tungsten-containing film on a substrate is provided which includes depositing a metal-containing barrier layer on the substrate, depositing a ruthenium layer on the metal-containing layer, depositing a tungsten nucleation layer on the ruthenium layer, and depositing a tungsten bulk layer on the tungsten nucleation layer.

In another example, a method for depositing a tungsten-containing film on a substrate is provided which includes depositing a tantalum-containing barrier layer on the substrate by a first atomic layer deposition process, depositing a ruthenium layer on the tantalum-containing layer by a second atomic layer deposition process, exposing the ruthenium layer to a soak process, and depositing a tungsten nucleation layer on the ruthenium layer by a third atomic layer deposition process.

In another example, a method for depositing a tungsten-containing film on a substrate is provided which includes depositing a ruthenium layer on the substrate by a first atomic layer deposition process, exposing the ruthenium layer to a soak process, depositing a tungsten nucleation layer on the ruthenium layer by a second atomic layer deposition process, and depositing a bulk tungsten layer to the nucleation tungsten layer.

In another example, a method for depositing a tungsten-containing film on a substrate is provided which includes depositing a ruthenium layer on the substrate by a first atomic layer deposition process, and exposing the ruthenium layer to a soak process, and depositing a tungsten nucleation layer on the ruthenium layer by a second atomic layer deposition process. The soak process may include flowing a soak compound for a predetermined time of about 5 seconds to about 90 seconds. The soak compound may include hydrogen, borane, diborane, silane, disilane, trisilane, dichlorosilane, derivatives thereof and combinations thereof.

In another example, a method of forming a film on a substrate surface is provided which includes positioning a substrate containing a tantalum-containing layer within a process chamber and depositing a ruthenium layer on the tantalum-containing layer. The ruthenium layer may be deposited by a deposition process that includes exposing a ruthenium-containing compound to the substrate surface, purging the process chamber with a purge gas, reducing the ruthenium-containing compound with a reagent to form a ruthenium layer on the substrate surface, and purging the process chamber with the purge gas. The method further includes depositing a tungsten layer on the ruthenium layer. The ruthenium-containing compound may be selected from the group consisting of bis(cyclopentadienyl)ruthenium compounds, bis(alkylcyclopentadienyl)ruthenium compounds, bis(dialkylcyclopentadienyl)ruthenium compounds, bis(pentadienyl)ruthenium compounds, bis(alkylpentadienyl)ruthenium compounds and bis(dialkylpentadienyl)ruthenium compounds.

In another example, a method of forming a ruthenium layer on a substrate for use in integrated circuit fabrication is provided which includes depositing a barrier layer on a substrate surface by a first ALD process. The barrier layer may include tantalum, tantalum nitride, tantalum silicon nitride, titanium, titanium nitride, titanium silicon nitride, tungsten, tungsten nitride and combinations thereof. The method further includes depositing the ruthenium layer on the barrier layer by a second ALD process and depositing a tungsten layer on the ruthenium layer. The second ALD process includes exposing the barrier layer to a ruthenium-containing compound within a process chamber, chemisorbing a ruthenium-containing layer on the barrier layer, exposing the ruthenium-containing layer to a reagent, and reacting the reagent with the ruthenium-containing layer to form the ruthenium layer on the barrier layer.

In another example, a method of forming a ruthenium layer on a substrate for use in integrated circuit fabrication is provided which includes depositing a barrier layer on a substrate surface by a first deposition process. The barrier may include tantalum, tantalum nitride, tantalum silicon nitride, titanium, titanium nitride, titanium silicon nitride, tungsten, tungsten nitride and combinations thereof. The method further includes depositing the ruthenium layer on the barrier layer by a first ALD process that includes sequentially exposing the barrier layer to a ruthenium-containing compound and a reagent and depositing a tungsten layer on the ruthenium layer by a second ALD process that includes sequentially exposing the ruthenium layer to a tungsten-containing compound and a reductant.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
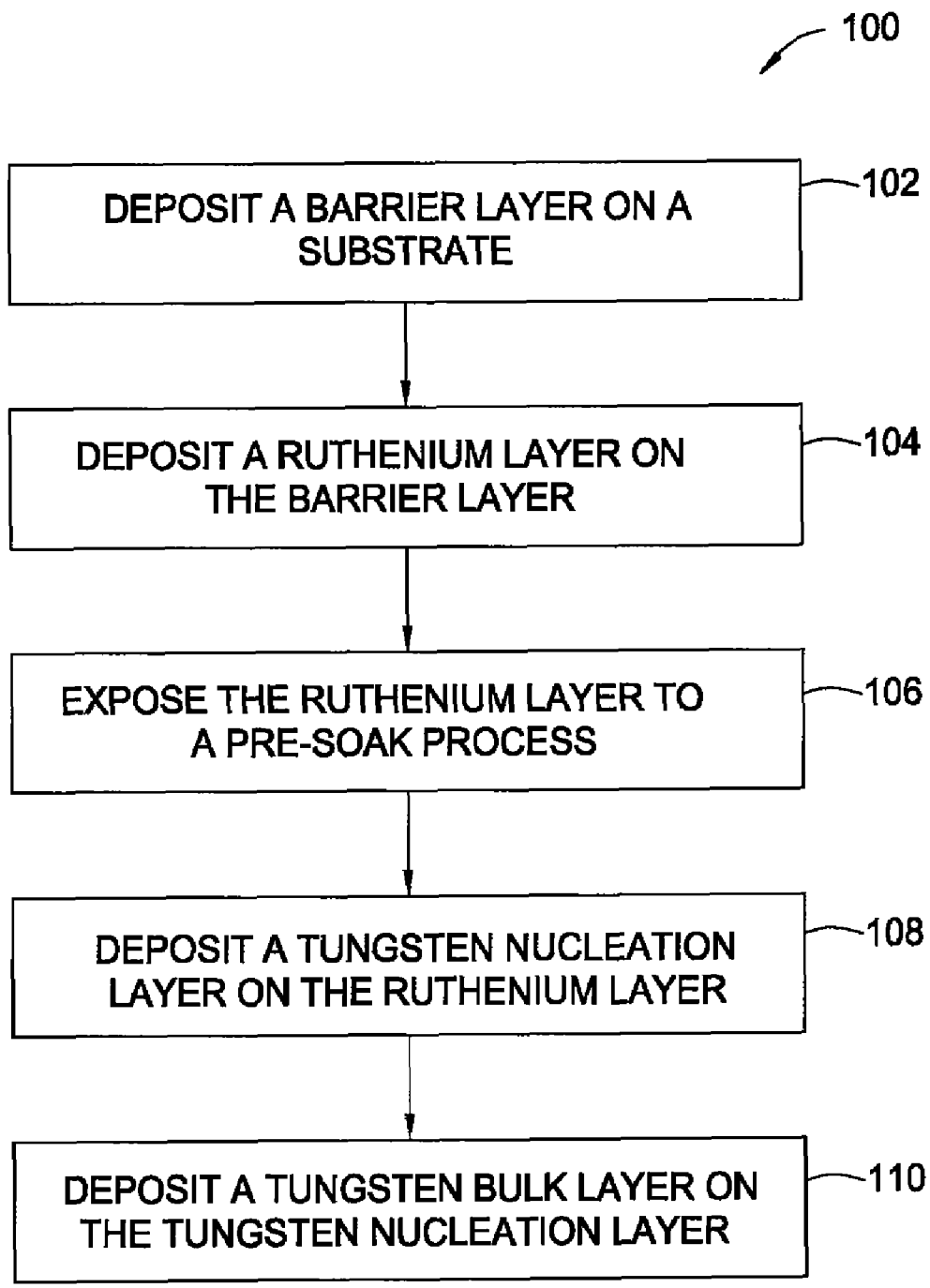
FIG. 1 depicts a process sequence according to one embodiment described herein.

A method for depositing multiple layers of materials to form electronic devices is disclosed. Generally, the method includes depositing a barrier layer on a substrate surface, depositing a ruthenium layer on the barrier layer, depositing a tungsten nucleation layer on the ruthenium layer, and depositing a tungsten bulk layer on the tungsten nucleation layer. During the deposition of any of the aforementioned layers, the method may include a variety of deposition techniques including atomic layer deposition (ALD), chemical vapor deposition (CVD), physical vapor deposition (PVD), electrochemical plating (ECP) and/or electroless plating. Preferably, the method utilizes ALD processes to deposit the barrier layer, the ruthenium layer, the tungsten nucleation layer and the tungsten bulk layer. Also, a pre-soak process to nucleate an underlayer may be used prior to starting any of the deposition processes, for example, a ruthenium layer may be exposed to a pre-soak process that includes a reductant prior to the deposition of a tungsten nucleation layer or a tungsten nucleation layer may be exposed to a soak process prior to the deposition of a tungsten bulk layer.

A "substrate surface" as used herein refers to any substrate or material surface formed on a substrate upon which film processing is performed. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes. Embodiments of the processes described herein deposit barrier and/or adhesive layers on many substrates and surfaces, especially, dielectric materials. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle may start with either compound A or compound B and continue the respective order of the cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein to refer to a pulse of a precursor followed by a purge step.

Barrier Layer Formation

FIG. 1 depicts a process 100 according to one embodiment described herein for fabricating an integrated circuit. Process 100 includes steps 102-110, wherein during step 102, a barrier layer, such as a metal-containing barrier layer is deposited on a substrate surface. A ruthenium layer is deposited on the barrier layer during step 104, preferably, by an ALD process. Subsequently in step 106, the ruthenium layer is exposed to a pre-soak process that may include a reductant, such as silane or diborane. During step 108, a tungsten nucleation layer is deposited on the ruthenium layer. Preferably, the tungsten nucleation layer is deposited by an ALD process. Thereafter at step 110, a tungsten bulk layer is deposited on the tungsten nucleation layer, preferably by a CVD process. Optionally, a pre-soak process similarly used in step 106, may be conducted between steps 102 and 104, as well as between steps 108 and 110.

Figure 2A:
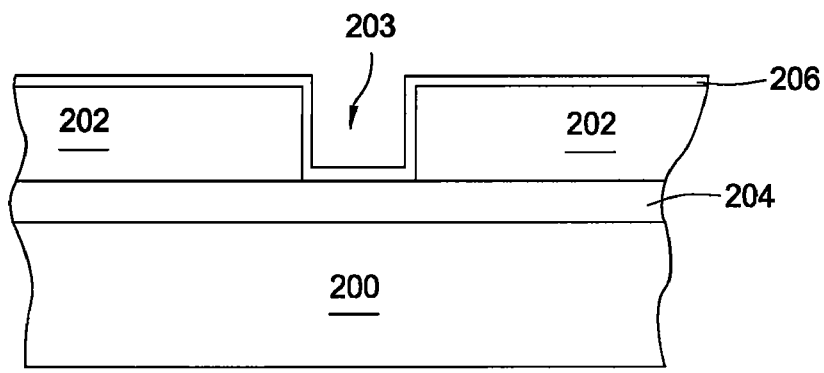
FIGS. 2A-2D illustrate schematic cross-sectional views of an integrated circuit fabrication sequence.

Process 100 includes steps 102-110 that correspond to FIGS. 2A-2D illustrating schematic cross-sectional views of a substrate at different stages of an interconnect fabrication sequence incorporating one embodiment of the present invention. FIG. 2A illustrates a cross-sectional view of substrate 200 having a metal contact layer 204 and dielectric layer 202 formed thereon. Substrate 200 may comprise a semiconductor material such as, for example, silicon, germanium, or gallium arsenide. Dielectric layer 202 may comprise an insulating material such as, silicon dioxide, silicon nitride, SOI, silicon oxynitride and/or carbon-doped silicon oxides, such as $SiO_xC_y$, for example, BLACK DIAMOND® low-k dielectric, available from Applied Materials, Inc., located in Santa Clara, Calif. Metal contact layer 204 comprises a conductive material, for example, tungsten, copper, aluminum and alloys thereof. A via or aperture 203 may be defined in the dielectric layer 202 to provide openings over metal contact layer 204. Aperture 203 may be defined in dielectric layer 202 using conventional lithography and etching techniques.

Barrier layer 206 may be formed on dielectric layer 202 as well as in aperture 203. Barrier layer 206 may include one or more barrier materials such as, for example, tantalum, tantalum nitride, tantalum silicon nitride, titanium, titanium nitride, titanium silicon nitride, tungsten nitride, silicon nitride, ruthenium nitride, derivatives thereof, alloys thereof and combinations thereof. Barrier layer 206 may be formed using a suitable deposition process, such as ALD, CVD, PVD or electroless deposition. For example, tantalum nitride may be deposited using a CVD process or an ALD process wherein tantalum-containing compound or tantalum precursor (e.g., PDMAT) and nitrogen-containing compound or nitrogen precursor (e.g., ammonia) are reacted. In one embodiment, tantalum and/or tantalum nitride is deposited as barrier layer 206 by an ALD process as described in commonly assigned U.S. Ser. No. 10/281,079, filed Oct. 25, 2002, and published as US 2003-0121608, which is herein incorporated by reference. In one example, a Ta/TaN bilayer may be deposited as barrier layer 206, wherein the tantalum layer and the tantalum nitride layer are independently deposited by ALD, CVD and/or PVD processes.

Figure 3:
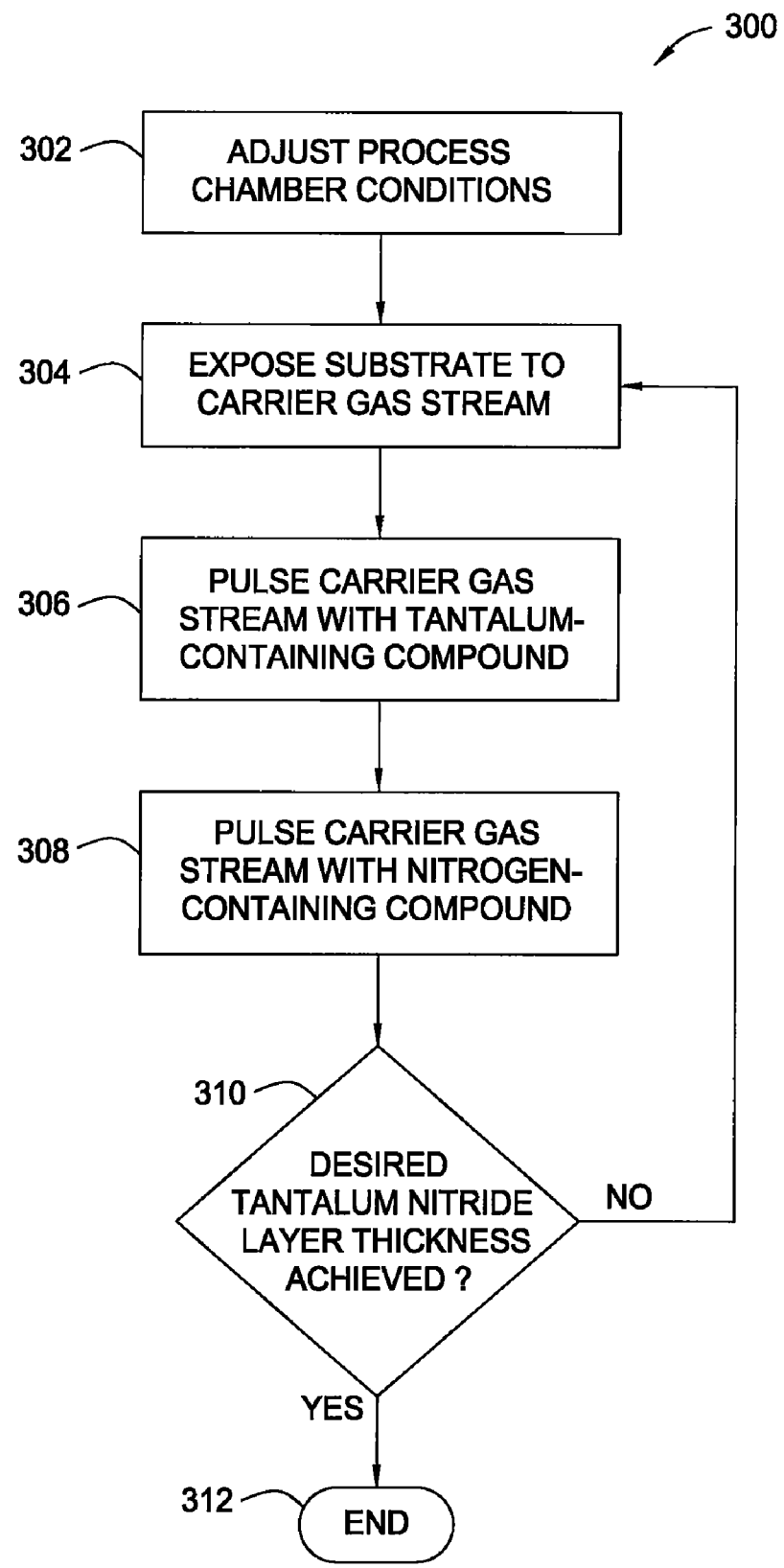
FIG. 3 illustrates a process sequence for tantalum nitride formation using cyclical deposition techniques according to one embodiment described herein.
Figure 4:
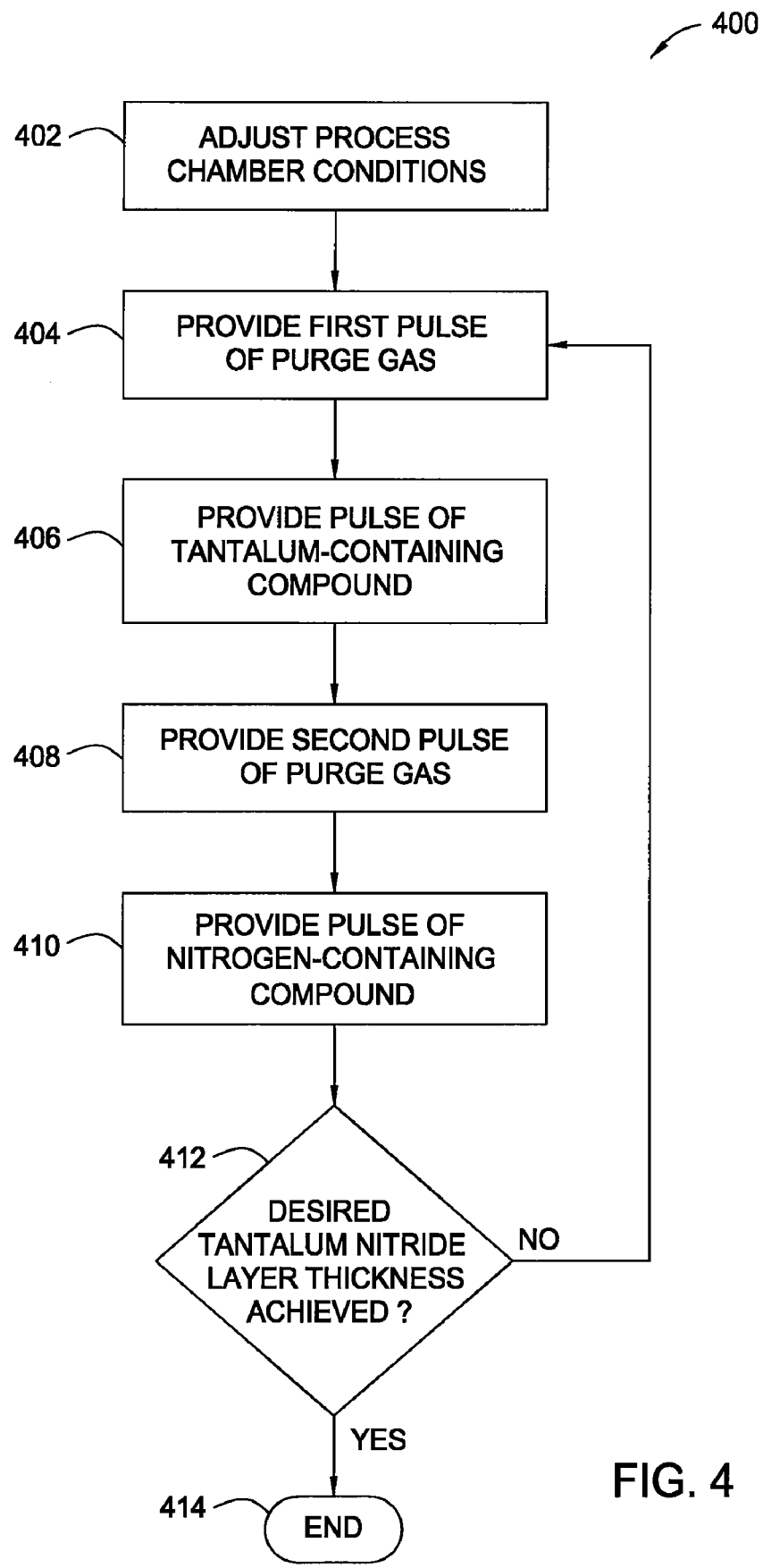
FIG. 4 illustrates a process sequence for tantalum nitride formation using cyclical deposition techniques according to an alternate embodiment described herein.

FIGS. 3 and 4 illustrate a process sequence for tantalum nitride formation using an ALD process or similar cyclical deposition techniques. In one embodiment, a tantalum nitride layer is deposited by an ALD process as barrier layer 206. During process 300 in FIG. 3, a constant flow of carrier gas or flow gas is administered into the process chamber. At step 302, the chamber conditions are adjusted, such as temperature and pressure. During deposition, the substrate may be maintained approximately below a thermal decomposition temperature of a selected tantalum-containing compound. An exemplary heater temperature range to be used with tantalum-containing compounds identified herein is approximately between about 20° C. and about 500° C. at a chamber pressure less than about 100 Torr, preferably less than about 50 Torr. When the tantalum-containing gas contains PDMAT, the heater temperature is preferably from about 100° C. to about 400° C., more preferably from about 175° C. to 250° C., and the chamber pressure is maintained in a range from about 1.0 Torr to about 5.0 Torr.

During step 304, the substrate is exposed to a carrier gas stream, generally, a steady stream of carrier gas. The carrier gas may include nitrogen, argon, hydrogen, helium, forming gas or combinations thereof. Preferably, the substrate is exposed to a stream of nitrogen. During step 306, a pulse of a tantalum-containing compound or tantalum precursor, such as pentakis(dimethylamino)tantalum (PDMAT or $Ta(NMe_2)_5$), is introduced into the process chamber. The tantalum-containing compound may be provided with the aid of a carrier gas or purge gas independent from the stream of carrier gas. The tantalum precursor is exposed to the substrate to form a tantalum-containing layer on the substrate surface. The tantalum-containing compound adsorbs on the substrate surface, generally forming a monolayer thick film. During step 308, a pulse of a nitrogen-containing compound or nitrogen precursor, such as ammonia, may be introduced into the process chamber by submitting a nitrogen precursor pulse to the carrier gas stream. The nitrogen precursor reacts with the tantalum-containing layer to form a tantalum nitride layer on the substrate surface. A carrier gas may also be used to help deliver the nitrogen precursor.

At step 310, the thickness of the tantalum nitride layer is determined. If the predetermined thickness is not achieved, then steps 304-308 are sequentially repeated in a cycle until the predetermined thickness is achieved. Once the predetermined thickness of the tantalum nitride layer is achieved, then process 300 is ceased at step 312. Process 300 provides a tantalum nitride layer in a thickness from about 0.5 Å to about 1.0 Å per cycle.

Generally, a tantalum nitride layer is generally deposited with a film thickness from about 5 Å to about 150 Å, preferably from about 5 Å to about 50 Å, such as about 15 Å. In one example, a tantalum nitride layer is deposited to a via with sidewall coverage of about 50 Å or less, preferably about 20 Å or less and more preferably 10 Å or less. A tantalum nitride layer with a thickness of about 10 Å or less is believed to be a sufficient thickness in the application as a barrier layer to prevent diffusion of subsequently deposited metals, such as ruthenium. In one aspect, a thin barrier layer may be used to advantage in filling sub-micron (e.g., less than 0.15 μm) and smaller features having high aspect ratios (e.g., greater than 30 to 1).

In another embodiment, a purge gas may be provided in pulses sequentially between each pulse of the tantalum-containing compound and nitrogen-containing compound, as depicted by process 400 in FIG. 4. During step 402, the chamber conditions are adjusted, such as temperature and pressure. During a deposition process, the substrate may be maintained approximately below a thermal decomposition temperature of a selected tantalum-containing compound. An exemplary heater temperature range to be used with tantalum-containing compounds identified herein is approximately between about 20° C. and about 500° C. at a chamber pressure of about 100 Torr or less, preferably of about 50 Torr or less. When the tantalum-containing gas contains PDMAT, the heater temperature is preferably from about 100° C. to about 400° C., more preferably from about 175° C. to about 250° C., and the chamber pressure is maintained in a range from about 1.0 Torr to about 5.0 Torr.

During step 404, a first pulse purge gas is administered into the process chamber. The purge gas may be the same or different gas used as a carrier gas. Generally, the purge gas may include nitrogen, argon, hydrogen, helium, forming gas or combinations thereof. At step 406, a pulse of tantalum-containing compound, such as PDMAT, is introduced into the process chamber. The tantalum-containing compound may be provided with the aid of a carrier gas or purge gas independent from the stream of carrier gas. The tantalum-containing compound is exposed to the substrate to form a tantalum-containing film on the substrate surface. The tantalum-containing compound adsorbs on the substrate surface, generally forming a monolayer thick film.

At step 408, another pulse of purge gas is administered into the process chamber. The purge gas assists in removing excess tantalum-containing compound in the process chamber. During step 410, a pulse of a nitrogen-containing compound or nitrogen precursor, such as ammonia, may be introduced into the process chamber. The nitrogen-containing compound reacts with the tantalum-containing layer to form a tantalum nitride layer on the substrate surface. A carrier gas may also be used to help deliver the nitrogen-containing compound.

At step 412, the thickness of the tantalum nitride layer is determined. If the predetermined thickness is not achieved, then steps 404-410 are sequentially repeated in a cycle until the predetermined thickness is achieved. Once the predetermined thickness of the tantalum nitride layer is achieved, then process 400 is ceased at step 414. Process 400 provides a tantalum nitride layer in a thickness from about 0.5 Å to about 1.0 Å per cycle.

Although process 400 is illustrated by sequentially pulsing a purge gas, a tantalum-containing compound, the purge gas and a nitrogen-containing compound, other combinations of order may be performed. The process may start a cycle with either a tantalum-containing compound or a nitrogen-containing compound. For example, a cycle may include sequentially pulsing a tantalum-containing compound, a purge gas, a nitrogen-containing compound and the purge gas, or a cycle may include sequentially pulsing a nitrogen-containing compound, a purge gas, a tantalum-containing compound and the purge gas.

Examples of tantalum-containing compounds, include, but are not limited to precursors such as PDMAT, pentakis(ethylmethylamino) tantalum (PEMAT or Ta[N(Et)Me]$_5$), pentakis(diethylamino)tantalum (PDEAT or Ta(NEt$_2$)$_5$,), tertiarybutylimino-tris(dimethylamino) tantalum (TBTDMT or ($^t$BuN)Ta(NMe$_2$)$_3$), tertiarybutylimino-tris(diethylamino) tantalum (TBTDET or ($^t$BuN)Ta(NEt$_2$)$_3$), tertiarybutylimino-tris(ethylmethylamino) tantalum (TBTEAT or ($^t$BuN)Ta[N(Et)Me]$_3$), tertiaryamylimino-tris(dimethylamino) tantalum (TAIMATA or ($^t$AmylN)Ta(NMe$_2$)$_3$, wherein $^t$Amyl is the tertiaryamyl group (C$_5$H$_{11}$— or CH$_3$CH$_2$C(CH$_3$)$_2$—), tertiaryamylimino-tris(diethylamino) tantalum (TAIEATA or ($^t$AmylN)Ta(NEt$_2$)$_3$, tertiaryamylimino-tris(ethylmethylamino) tantalum (TAIMATA or ($^t$AmylN)Ta([N(Et)Me]$_3$), tantalum halides, such as TaF$_5$ or TaCl$_5$, combinations thereof and/or derivatives thereof. Examples of nitrogen containing-compounds include, but are not limited to precursors such as ammonia (NH$_3$), hydrazine (N$_2$H$_4$), methylhydrazine (Me(H)NNH$_2$), dimethyl hydrazine (Me$_2$NNH$_2$ or Me(H)NN(H)Me), tertiarybutylhydrazine ($^t$Bu(H)NNH$_2$), phenylhydrazine (C$_6$H$_5$(H)NNH$_2$), a nitrogen plasma source (e.g., N, N$_2$, N$_2$/H$_2$, NH$_3$, or a N$_2$H$_4$ plasma), 2,2'-azotertbutane ($^t$BuNN$^t$Bu), an azide source, such as ethyl azide (EtN$_3$), trimethylsilyl azide (Me$_3$SiN$_3$), derivatives thereof and combinations thereof.

The tantalum nitride layer formation is described as starting with the adsorption of a monolayer of a tantalum-containing compound on the substrate followed by a monolayer of a nitrogen-containing compound. Alternatively, the tantalum nitride layer formation may start with the adsorption of a monolayer of a nitrogen-containing compound on the substrate followed by a monolayer of the tantalum-containing compound. Furthermore, in other embodiments, a pump evacuation alone between pulses of reactant gases may be used to prevent mixing of the reactant gases.

For processes 300 and 400, the time duration for each pulse of the tantalum-containing compound, the time duration for each pulse of the nitrogen-containing compound, and the duration of the purge gas between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum-containing compound or the nitrogen-containing compound should be long enough for adsorption of a monolayer of the compound. In one aspect, a pulse of a tantalum-containing compound may still be in the chamber when a pulse of a nitrogen-containing compound enters. In general, the duration of the purge gas and/or pump evacuation should be long enough to prevent the pulses of the tantalum-containing compound and the nitrogen-containing compound from mixing together in the reaction zone.

Generally, a pulse time of about 1.0 second or less for a tantalum-containing compound and a pulse time of about 1.0 second or less for a nitrogen-containing compound are typically sufficient to absorb alternating monolayers on a substrate structure. A time of about 1.0 second or less between pulses of the tantalum-containing compound and the nitrogen-containing compound is typically sufficient for the purge gas, whether a continuous purge gas or a pulse of a purge gas, to prevent the pulses of the tantalum-containing compound and the nitrogen-containing compound from mixing together in the reaction zone. Of course, a longer pulse time of the reactants may be used to ensure absorption of the tantalum-containing compound and the nitrogen-containing compound and a longer time between pulses of the reactants may be used to ensure removal of the reaction by-products.

An exemplary process of depositing a tantalum nitride layer by cyclical deposition comprises providing pulses of PDMAT at a flow rate between about 20 sccm and about 1,000 sccm, preferably between about 100 sccm and about 400 sccm, for a pulse time of about 0.5 seconds or less, about 0.1 seconds or less, or about 0.05 seconds or less. Pulses of ammonia may be provided at a flow rate between about 20 sccm and about 1,000 sccm, preferably between 200 sccm and about 600 sccm, for a pulse time of about 0.5 seconds or less, about 0.1 seconds or less, or about 0.05 seconds or less. An argon purge gas at a flow rate between about 100 sccm and about 1,000 sccm, preferably, between about 100 sccm and about 400 sccm, may be continuously provided. The time between pulses of the tantalum-containing compound and the nitrogen-containing compound may be about 0.5 seconds or less, about 0.1 seconds or less, or about 0.07 seconds or less. The heater temperature preferably is maintained between about 100° C. and about 300° C. at a chamber pressure between about 1.0 Torr and about 5.0 Torr.

Embodiments of cyclical deposition have been described above as adsorption of a monolayer of reactants on a substrate. The present invention also includes embodiments in which the reactants are deposited on a surface with a thickness more or less than a monolayer. The present invention also includes embodiments in which the reactants are not deposited in a self-limiting manner. The present invention also includes embodiments in which deposition occurs in mainly a chemical vapor deposition process in which the reactants are delivered sequentially or simultaneously. Embodiments of cyclical deposition have been described above as the deposition of a binary compound of tantalum nitride utilizing pulses of two reactants. In the deposition of other elements or compounds, pulses of two or more reactants may also be used.

Ruthenium Layer Formation

Figure 2B:
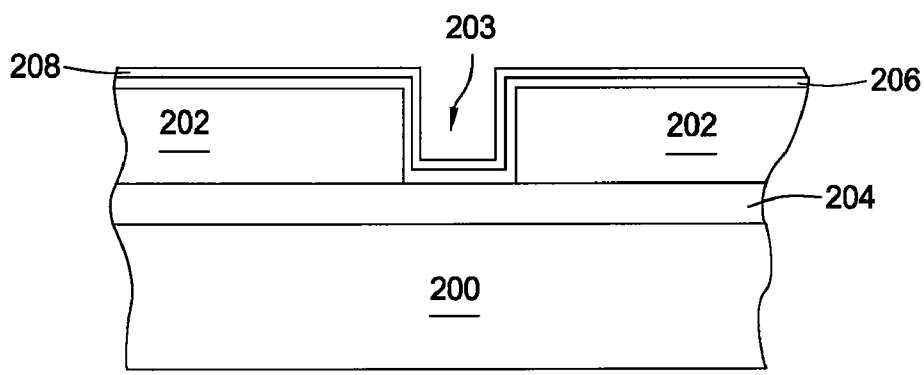

Process 100 further includes step 104, wherein ruthenium layer 208 is formed on barrier layer 206, as depicted in FIG. 2B. Ruthenium layer 208 may be deposited on barrier layer 206 by ALD, CVD or PVD processes, preferably, by an ALD process. The barrier layer may be optionally exposed to a pre-soak process prior to the deposition of ruthenium layer 208. The pre-soak process may include exposing the substrate surface to a reductant, such as hydrogen, borane, diborane, alkyboranes (e.g., ethylborane), silane, disilane, trisilane, alkyl silanes (e.g., methylsilane), halosilanes (e.g., dichlorosilane), derivatives thereof and combinations thereof.

In one example, ruthenium layer 208 is deposited using an ALD or a cyclical deposition process that includes alternately adsorbing a ruthenium-containing precursor and a reducing gas containing a reductant on a substrate structure. The ruthenium-containing precursor and the reducing gas undergo a reaction to form ruthenium layer 208 on barrier layer 206. Ruthenium layer 208 may be deposited with a thickness less than about 1,000 Å, preferably less than about 500 Å and more preferably in a range from about 10 Å to about 100 Å, for example, about 30 Å. In another example, instead of a ruthenium layer, a noble-metal layer may be deposited on barrier layer 206, such as palladium, platinum, cobalt, nickel, rhodium, and combinations thereof. A further description of cyclic layer deposition of ruthenium and other noble metals is disclosed in commonly assigned U.S. Ser. No. 10/811,230, filed Mar. 26, 2004, and published as US 2004-0241321, and U.S. Ser. No. 10/634,662, filed Aug. 4, 2003, and issued as U.S. Pat. No. 7,404,985, and U.S. Ser. No. 10/443,648, filed May 22, 2003, and issued as U.S. Pat. No. 7,264,846, which are each herein incorporated by reference.

Figure 5:
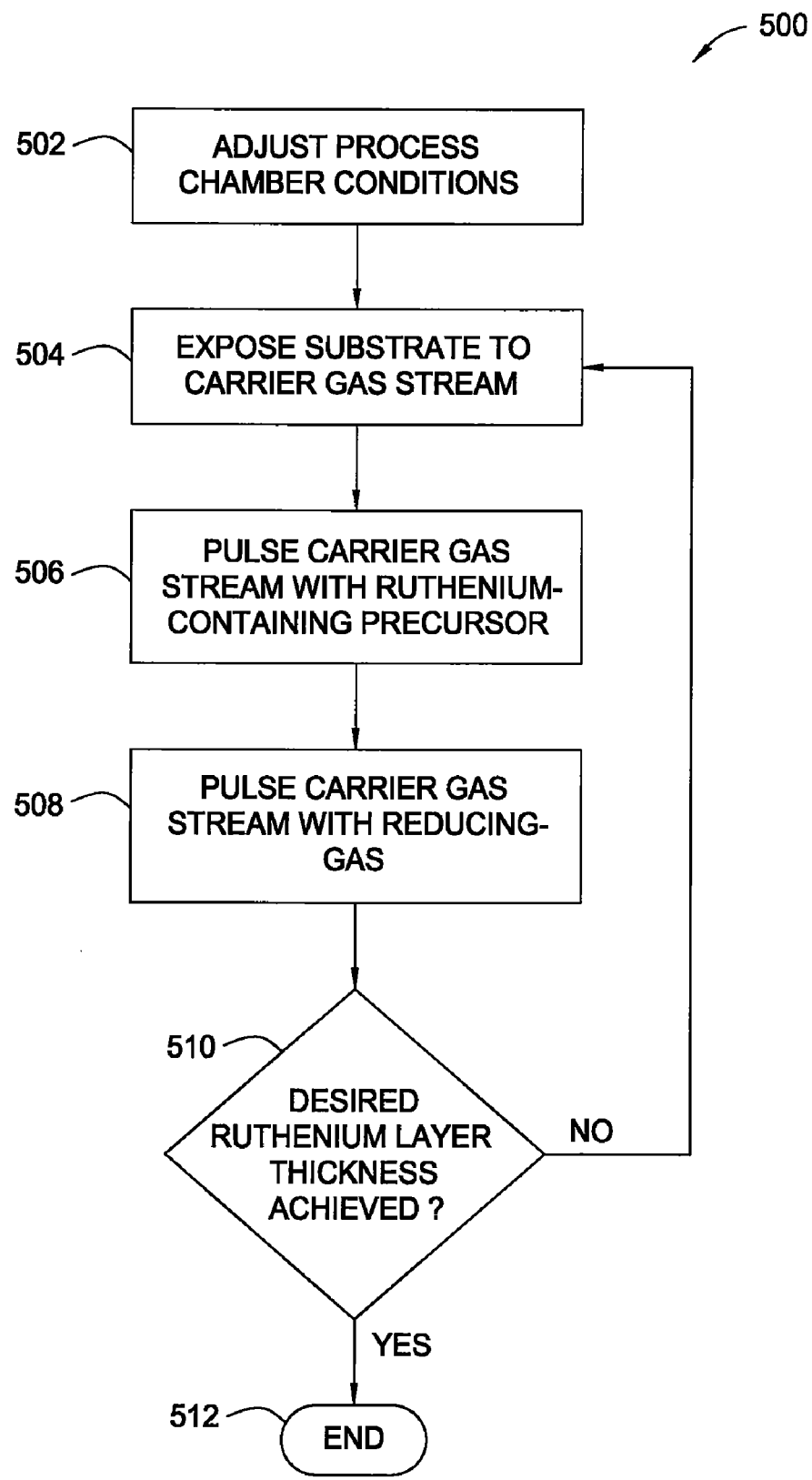
FIG. 5 illustrates a process sequence for ruthenium layer formation using cyclical deposition techniques according to one embodiment described herein.

FIG. 5 illustrates process 500 detailing the various steps used for the deposition of ruthenium layer 208 during one embodiment of an ALD process. As shown in step 502, a substrate is provided to the process chamber. The process chamber conditions, such as the temperature and pressure, are adjusted to enhance the adsorption of the process gases on the substrate so as to facilitate the reaction of the ruthenium-containing precursor and the reductant.

For ruthenium layer deposition, the substrate may be maintained at a temperature less than about 800° C., preferably in a range from about 200° C. to about 600° C. The process chamber pressure is maintained in a range from about 0.1 Torr to about 80 Torr, preferably from about 1 Torr to about 10 Torr. The ruthenium-containing precursor may be provided at a flow rate in a range from about 0.01 sccm to about 20 sccm, preferably from about 0.1 sccm to about 5 sccm, and more preferably between about 0.1 sccm to about 1 sccm. The reducing gas may be provided at a flow rate in a range from about 1 sccm to about 2,000 sccm, preferably between about 20 sccm to about 300 sccm, for example, about 200 sccm.

During process 500, a constant carrier gas flow is established within the process chamber and exposed to the substrate, as illustrated in step 504. Carrier gases may be selected so as to also act as a purge gas for the removal of volatile reactants and/or by-products from the process chamber. Carrier or purge gases such as, for example, helium, argon, nitrogen, hydrogen, forming gas and combinations thereof. The carrier gas may be provided at a flow rate in a range from about 500 sccm to about 5,000 sccm, preferably from about 500 sccm to about 2,500 sccm for 200 mm substrates and from about 1,000 sccm to about 5,000 sccm for 300 mm substrates.

Referring to step 506, after the carrier gas stream is established within the process chamber, a pulse of a ruthenium-containing precursor (e.g., ruthenocene or bis(2,4-dimethylpentadienyl)ruthenium) is added to the carrier gas stream. The pulse of the ruthenium-containing precursor lasts for a predetermined time interval, such as a range from about 0.01 second to about 10 seconds, preferably from about 0.05 second to about 4 seconds, for example, about 2 seconds.

Ruthenium-containing precursors may include ruthenocene compounds and ruthenium compounds containing at least one open chain dienyl ligand. Ruthenocene compounds contain at least one cyclopentyl ligand such as $R_xC_5H_{5-x}$, where x=0-5 and R is independently hydrogen or an alkyl group and include bis(cyclopentadienyl)ruthenium compounds, bis(alkylcyclopentadienyl)ruthenium compounds, bis(dialkylcyclopentadienyl)ruthenium compounds and derivatives thereof, where the alkyl groups may be independently methyl, ethyl, propyl or butyl. A bis(cyclopentadienyl)ruthenium compound has a generic chemical formula $(R_xC_5H_{5-x})_2Ru$, where x=0-5 and R is independently hydrogen or an alkyl group such as methyl, ethyl, propyl or butyl.

Ruthenium compounds containing at least one open chain dienyl ligand may contain a ligand such as $CH_2CRCHCRCH_2$, where R is independently an alkyl group or hydrogen. In some examples, the ruthenium-containing precursor may have two open-chain dienyl ligands, such as pentadienyl or heptadienyl and include bis(pentadienyl)ruthenium compounds, bis(alkylpentadienyl)ruthenium compounds and bis(dialkylpentadienyl)ruthenium compounds. A bis(pentadienyl)ruthenium compound has a generic chemical formula $(CH_2CRCHCRCH_2)_2Ru$, where R is independently an alkyl group or hydrogen. Usually, R is independently hydrogen, methyl, ethyl, propyl or butyl. Also, ruthenium-containing precursor may have both an one open-chain dienyl ligand and a cyclopentadienyl ligand.

Therefore, examples of ruthenium-containing precursors useful during the deposition process described herein include bis(cyclopentadienyl)ruthenium ($Cp_2Ru$), bis(methylcyclopentadienyl)ruthenium, bis(ethylcyclopentadienyl)ruthenium, bis(pentamethylcyclopentadienyl)ruthenium, bis(2,4-dimethylpentadienyl)ruthenium, bis(2,4-diethylpentadienyl) ruthenium, bis(2,4-diisopropyl pentadienyl)ruthenium, bis(2,4-ditertbutylpentadienyl)ruthenium, bis(methylpentadienyl)ruthenium, bis(ethylpentadienyl) ruthenium, bis(isopropylpentadienyl)ruthenium, bis(tertbutylpentadienyl)ruthenium, derivatives thereof, and combinations thereof. In some embodiments, other ruthenium-containing compounds include tris(2,2,6,6-tetramethyl-3,5-heptanedionato) ruthenium, dicarbonyl pentadienyl ruthenium, ruthenium acetyl acetonate, (2,4-dimethylpentadienyl)ruthenium (cyclopentadienyl), bis(2,2,6,6-tetramethyl-3,5-heptanedionato) ruthenium (1,5-cyclooctadiene), (2,4-dimethylpentadienyl)ruthenium (methylcyclopentadienyl), (1,5-cyclooctadiene)ruthenium (cyclopentadienyl), (1,5-cyclooctadiene)ruthenium(methylcyclopentadienyl), (1,5-cyclooctadiene)ruthenium (ethylcyclopentadienyl), (2,4-dimethylpentadienyl)ruthenium(ethylcyclopentadienyl), (2,4-dimethylpentadienyl)ruthenium (isopropylcyclopentadienyl), bis(N,N-dimethyl 1,3-tetramethyl diiminato) ruthenium (1,5-cyclooctadiene), bis(N,N-dimethyl 1,3-dimethyl diiminato) ruthenium (1,5-cyclooctadiene), bis(allyl) ruthenium (1,5-cyclooctadiene), ($\eta^6$-$C_6H_6$) ruthenium (1,3-cyclohexadiene), bis(1,1-dimethyl-2-aminoethoxylato)ruthenium (1,5-cyclooctadiene), bis(1,1-dimethyl-2-aminoethylaminato)ruthenium (1,5-cyclooctadiene), derivatives thereof, and combinations thereof.

Other noble metal-containing compounds may be used as a substitute for ruthenium-containing precursors to deposit their respective noble metal layer, such as precursors containing palladium, platinum, cobalt, nickel and rhodium. Palladium-containing precursors, for example, bis(allyl) palladium, bis(2-methylallyl)palladium, and (cyclopentadienyl) (allyl) palladium, derivatives thereof and combinations thereof. Suitable platinum-containing precursors include dimethyl(cyclooctadiene)platinum, trimethyl(cyclopentadienyl)platinum, trimethyl(methylcyclopentadienyl)platinum, cyclopentadienyl(allyl)platinum, methyl(carbonyl)cyclopentadienyl platinum, trimethyl(acetylacetonato)platinum, bis(acetylacetonato)platinum, derivatives thereof and combinations thereof. Suitable cobalt-containing precursors include bis(cyclopentadienyl)cobalt, (cyclopentadienyl) (cyclohexadienyl)cobalt, cyclopentadienyl (1,3-hexadienyl)cobalt, (cyclobutadienyl)(cyclopentadienyl)cobalt, bis(methylcyclopentadienyl)cobalt, (cyclopentadienyl) (5-methylcyclopentadienyl)cobalt, bis(ethylene)(pentamethylcyclopentadienyl)cobalt, derivatives thereof and combinations thereof. A suitable nickel-containing precursor includes bis(methylcyclopentadienyl) nickel and suitable rhodium-containing precursors include bis(carbonyl)(cyclopentadienyl)rhodium, bis(carbonyl)(ethylcyclopentadienyl) rhodium, bis(carbonyl)(methylcyclopentadienyl)rhodium, bis(propylene)rhodium, derivatives thereof, and combinations thereof.

The time interval for the pulse of the ruthenium-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the ruthenium-containing precursor provides a sufficient amount of precursor so that at least a monolayer of the ruthenium-containing precursor is adsorbed on the substrate. Thereafter, excess ruthenium-containing precursor remaining in the chamber may be removed from the process chamber by the constant carrier gas stream in combination with the vacuum system.

In step 508, after the excess ruthenium-containing precursor has been flushed from the process chamber by the carrier gas stream, a pulse of a reducing gas or reductant is added to the carrier gas stream. A reducing gas may include a reductant and another gas, such as a carrier gas. The pulse of the reducing gas also lasts for a predetermined time interval. In general, the time interval for the pulse of the reducing gas should be long enough for adsorption of at least a monolayer of the reducing gas on the ruthenium-containing compound. The pulse of reducing gas lasts for a predetermined time interval, such as a range from about 0.01 second to about 10 seconds, preferably from about 0.1 second to about 2 seconds and more preferably from about 0.1 second to about 1 second. Thereafter, excess reducing gas is flushed from the process chamber by the carrier gas stream.

Suitable reducing gases may include traditional reductants, for example, hydrogen (e.g., $H_2$ or atomic-H), ammonia ($NH_3$), silane ($SiH_4$), disilane ($Si_2H_6$), trisilane ($Si_3H_8$), tetrasilane ($Si_4H_{10}$), dimethylsilane ($SiC_2H_8$), methyl silane ($SiCH_6$), ethylsilane ($SiC_2H_8$), chlorosilane ($ClSiH_3$), dichlorosilane ($Cl_2SiH_2$), hexachlorodisilane ($Si_2Cl_6$), borane ($BH_3$), diborane ($B_2H_6$), triborane, tetraborane, pentaborane, alkylboranes, such as triethylborane ($Et_3B$), derivatives thereof and combinations thereof.

Also, the reducing gas may include oxygen-containing gases used as a reductant, such as oxygen (e.g., $O_2$), nitrous oxide ($N_2O$), nitric oxide (NO), nitrogen dioxide ($NO_2$), derivatives thereof and combinations thereof. Furthermore, the traditional reductants may be combined with the oxygen-containing reductants to form a reducing gas. Oxygen-containing gases that are used in embodiments of the present invention are traditionally used in the chemical art as an oxidant. However, ligands on an organometallic compound containing a noble metal (e.g., Ru) are usually more susceptible to the oxygen-containing reductants than the noble metal. Therefore, the ligand is generally oxidized from the metal center while the metal ion is reduced to form the elemental metal. In one example, the reducing gas is air containing ambient oxygen as the reductant. The air may be dried over sieves to reduce ambient water.

Process 500, including steps 504 through 508, comprise one embodiment of a deposition cycle for a ruthenium layer. A constant flow of carrier gas is provided to the process chamber modulated by alternating periods of pulsing and non-pulsing where the periods of pulsing alternate between the ruthenium-containing precursor and the reducing gas along with the carrier gas stream, while the periods of non-pulsing include only the carrier gas stream.

The time interval for each of the pulses of the ruthenium-containing precursor and the reducing gas may have the same duration. That is, the duration of the pulse of the ruthenium-containing precursor may be identical to the duration of the pulse of the reducing gas. For such an embodiment, a time interval ($T_1$) for the pulse of the ruthenium-containing precursor is equal to a time interval ($T_2$) for the pulse of the reducing gas.

Alternatively, the time interval for each of the pulses of the ruthenium-containing precursor and the reducing gas may have different durations. That is, the duration of the pulse of the ruthenium-containing precursor may be shorter or longer than the duration of the pulse of the reducing gas. For such an embodiment, a time interval ($T_1$) for the pulse of the ruthenium-containing precursor is different than the time interval ($T_2$) for the pulse of the reducing gas.

In addition, the periods of non-pulsing between each of the pulses of the ruthenium-containing precursor and the reducing gas may have the same duration. That is, the duration of the period of non-pulsing between each pulse of the ruthenium-containing precursor and each pulse of the reducing gas is identical. For such an embodiment, a time interval ($T_3$) of non-pulsing between the pulse of the ruthenium-containing precursor and the pulse of the reducing gas is equal to a time interval ($T_4$) of non-pulsing between the pulse of the reducing gas and the pulse of the ruthenium-containing precursor. During the time periods of non-pulsing only the constant carrier gas stream is provided to the process chamber.

Alternatively, the periods of non-pulsing between each of the pulses of the ruthenium-containing precursor and the reducing gas may have different duration. That is, the duration of the period of non-pulsing between each pulse of the ruthenium-containing precursor and each pulse of the reducing gas may be shorter or longer than the duration of the period of non-pulsing between each pulse of the reducing gas and the ruthenium-containing precursor. For such an embodiment, a time interval ($T_3$) of non-pulsing between the pulse of the ruthenium-containing precursor and the pulse of the reducing gas is different from a time interval ($T_4$) of non-pulsing between the pulse of the reducing gas and the pulse of ruthenium-containing precursor. During the time periods of non-pulsing only the constant carrier gas stream is provided to the process chamber.

Additionally, the time intervals for each pulse of the ruthenium-containing precursor, the reducing gas and the periods of non-pulsing therebetween for each deposition cycle may have the same duration. For such an embodiment, a time interval ($T_1$) for the ruthenium-containing precursor, a time interval ($T_2$) for the reducing gas, a time interval ($T_3$) of non-pulsing between the pulse of the ruthenium-containing precursor and the pulse of the reducing gas and a time interval ($T_4$) of non-pulsing between the pulse of the reducing gas and the pulse of the ruthenium-containing precursor each have the same value for each deposition cycle. For example, in a first deposition cycle ($C_1$), a time interval ($T_1$) for the pulse of the ruthenium-containing precursor has the same duration as the time interval ($T_1$) for the pulse of the ruthenium-containing precursor in subsequent deposition cycles ($C_2 \ldots C_n$). Similarly, the duration of each pulse of the reducing gas and the periods of non-pulsing between the pulse of the ruthenium-containing precursor and the reducing gas in the first deposition cycle ($C_1$) is the same as the duration of each pulse of the reducing gas and the periods of non-pulsing between the pulse of the ruthenium-containing precursor and the reducing gas in subsequent deposition cycles ($C_2 \ldots C_n$), respectively.

Alternatively, the time intervals for at least one pulse of the ruthenium-containing precursor, the reducing gas and the periods of non-pulsing therebetween for one or more of the deposition cycles of the ruthenium layer deposition process may have different durations. For such an embodiment, one or more of the time intervals ($T_1$) for the pulses of the ruthenium-containing precursor, the time intervals ($T_2$) for the pulses of the reducing gas, the time intervals ($T_3$) of non-pulsing between the pulse of the ruthenium-containing precursor and the reducing gas and the time intervals ($T_4$) of non-pulsing between the pulses of the reducing gas and the ruthenium-containing precursor may have different values for one or more deposition cycles of the cyclical deposition process. For example, in a first deposition cycle ($C_1$), the time interval ($T_1$) for the pulse of the ruthenium-containing precursor may be longer or shorter than one or more time interval ($T_1$) for the pulse of the ruthenium-containing precursor in subsequent deposition cycles ($C_2 \ldots C_n$). Similarly, the durations of the pulses of the reducing gas and the periods of non-pulsing between the pulse of the ruthenium-containing precursor and the reducing gas in the first deposition cycle ($C_1$) may be the same or different than the duration of each pulse of the reducing gas and the periods of non-pulsing between the pulse of the ruthenium-containing precursor and the reducing gas in subsequent deposition cycles ($C_2 \ldots C_n$).

Referring to step 510, after each deposition cycle (steps 504 through 508) a thickness of the ruthenium layer will be formed on the substrate. Depending on specific device requirements, subsequent deposition cycles may be needed to achieve a desired thickness. As such, steps 504 through 508 are repeated until the desired thickness for the ruthenium layer is achieved. Thereafter, when the desired thickness for the ruthenium layer is achieved the process is stopped as indicated by step 512.

Figure 6:
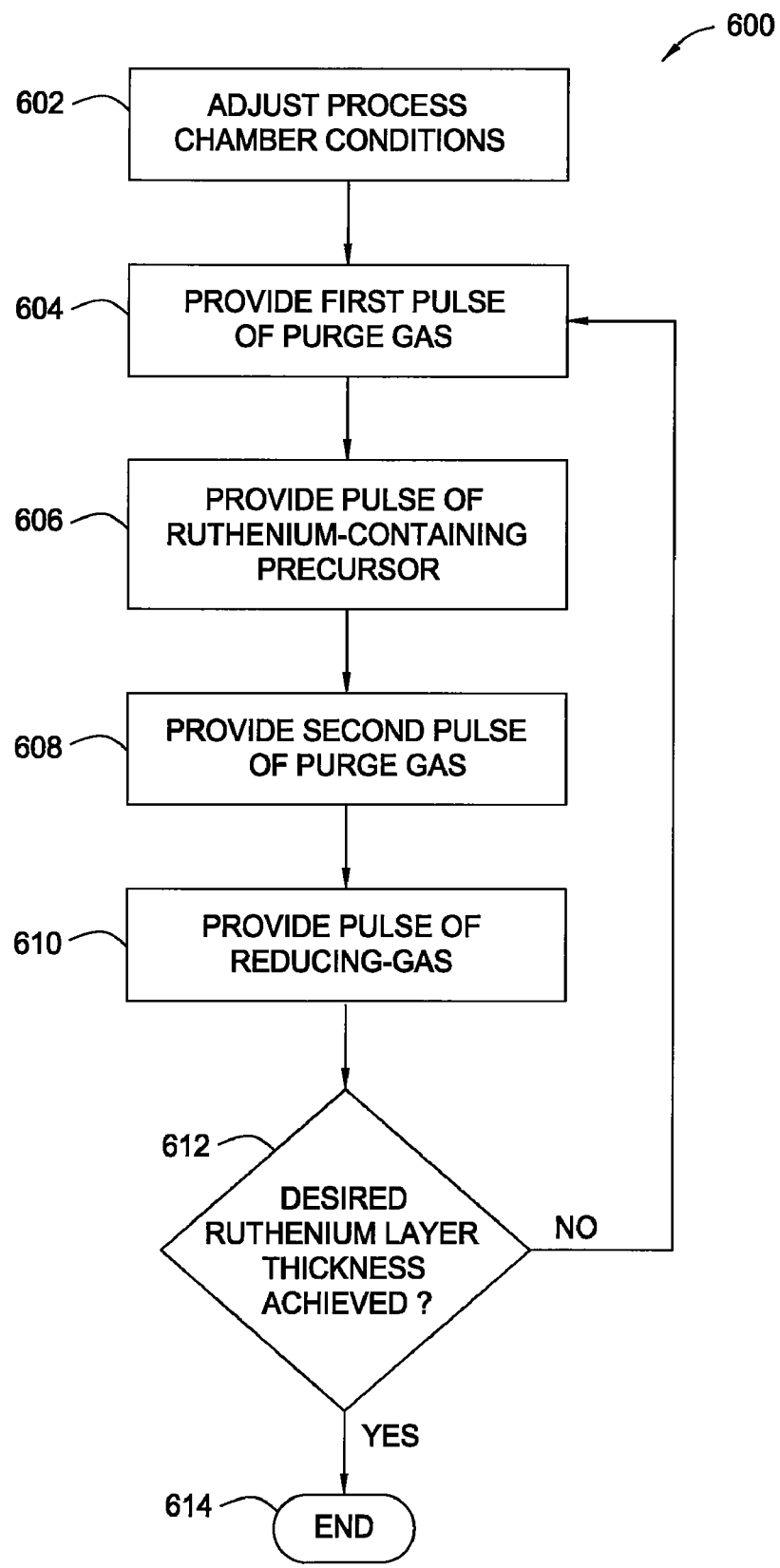
FIG. 6 illustrates a process sequence for ruthenium layer formation using cyclical deposition techniques according to an alternate embodiment described herein.

In an alternate process sequence described with respect to FIG. 6, the ruthenium layer deposition cycle comprises separate pulses for each of the ruthenium-containing precursor, the reductant and a purge gas. For such an embodiment, the ruthenium layer deposition sequence 600 includes providing a substrate to the process chamber and adjusting the process conditions (step 602), providing a first pulse of a purge gas to the process chamber (step 604), providing a pulse of a ruthenium-containing precursor to the process chamber (step 606), providing a second pulse of the purge gas to the process chamber (step 608), providing a pulse of a reducing gas to the process chamber (step 610), and then repeating steps 604 through 610, or stopping the deposition process (step 614) depending on whether a desired thickness for the ruthenium layer has been achieved (step 612).

In another embodiment, a purge gas may be provided in pulses sequentially between each pulse of the ruthenium-containing precursor and reducing gas, as depicted by process 600 in FIG. 6. During step 602, the chamber conditions are adjusted, such as temperature and pressure. During a deposition process, the substrate may be maintained approximately below a thermal decomposition temperature of a selected ruthenium-containing precursor. An exemplary heater temperature range to be used with ruthenium-containing precursors identified herein maintains the substrate at a temperature less than about 800° C., preferably less than about 600° C., and more preferably, about 400° C. or less. The chamber pressure is maintained at about 80 Torr or less, preferably in a range from about 1 Torr to about 10 Torr.

During step 604, a first pulse purge gas is administered into the process chamber. The purge gas may be the same or different gas used as a carrier gas. Generally, the purge gas may include nitrogen, argon, hydrogen, helium, forming gas or combinations thereof. At step 606, a pulse of ruthenium-containing precursor, such as ruthenocene or bis(2,4-dimethylpentadienyl)ruthenium, is introduced into the process chamber. The ruthenium-containing precursor may be provided with the aid of a carrier gas or purge gas independent from the stream of carrier gas. The ruthenium-containing precursor is exposed to the substrate to form a ruthenium-containing film on the substrate surface. The ruthenium-containing precursor adsorbs on the substrate surface, generally forming a monolayer thick film.

At step 608, another pulse of purge gas is administered into the process chamber. The purge gas assists in removing excess ruthenium-containing precursor in the process chamber. During step 610, a pulse of a reducing gas or reductant, such as diborane, silane or oxygen gas, may be introduced into the process chamber. The reducing gas reacts with the ruthenium-containing layer to form a ruthenium layer on the substrate surface, such as the barrier layer. A carrier gas may also be used to help deliver the reductant.

At step 612, the thickness of the ruthenium layer is determined. If the predetermined thickness is not achieved, then steps 604-610 are sequentially repeated in a cycle until the predetermined thickness is achieved. Once the predetermined thickness of the ruthenium layer is achieved, then process 600 is ceased at step 614. Process 600 may form a ruthenium layer at a rate in a range from about 0.5 Å to about 1.0 Å per cycle.

Although process 600 is illustrated by sequentially pulsing a purge gas, a ruthenium-containing precursor, the purge gas and a reducing gas, other combinations of order may be performed. The process may start a cycle with either a ruthenium-containing precursor or a reducing gas. For example, a cycle may include sequentially pulsing a ruthenium-containing precursor, a purge gas, a reducing gas and the purge gas, or a cycle may include sequentially pulsing a reducing gas, a purge gas, a ruthenium-containing precursor and the purge gas.

The time intervals for each of the pulses of the ruthenium-containing precursor, the reducing gas and the purge gas may have the same or different durations as discussed above with respect to FIG. 5. Alternatively, corresponding time intervals for one or more pulses of the ruthenium-containing precursor, the reducing gas and the purge gas in one or more of the deposition cycles of the ruthenium layer deposition process may have different durations.

In FIGS. 5-6, the ruthenium layer deposition cycle is depicted as beginning with a pulse of the ruthenium-containing precursor followed by a pulse of the reducing gas. Alternatively, the ruthenium layer deposition cycle may start with a pulse of the reducing gas followed by a pulse of the ruthenium-containing precursor.

Figure 8:
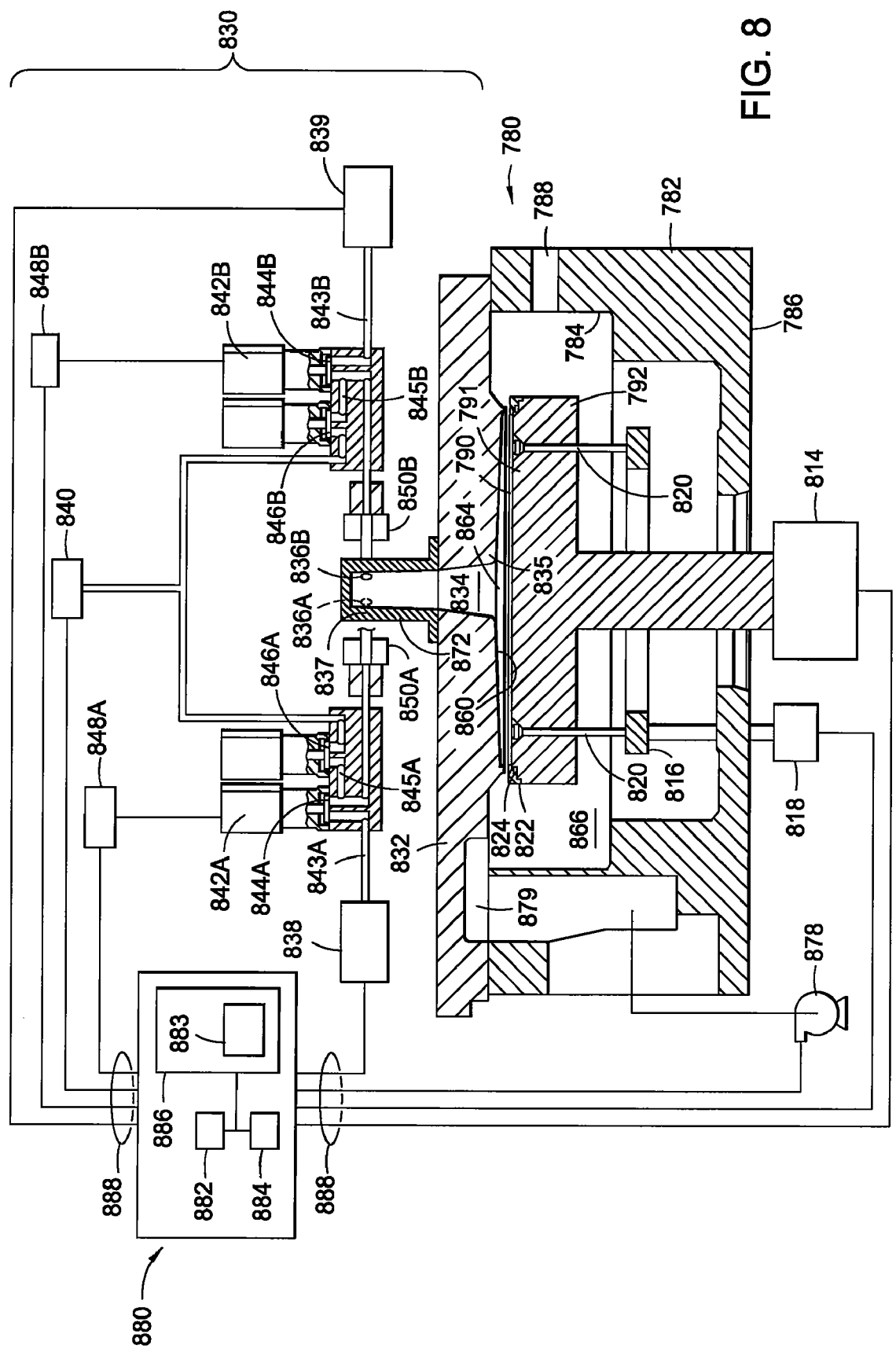
FIG. 8 depicts a schematic cross-sectional view of a process chamber that may be used to perform a cyclical deposition process described herein.

One exemplary process of depositing a ruthenium layer by an ALD process to a barrier layer in the process chamber 780 of FIG. 8 includes providing pulses of a ruthenium-containing precursor, such as bis(cyclopentadienyl)ruthenium ($Cp_2Ru$), from gas source 838 at a flow rate between about 0.01 sccm and about 5 sccm, preferably between about 0.1 sccm and about 1 sccm, through valve 842A for a pulse time of about 4 seconds or less, preferably about 1.5 seconds or less, such as about 0.1 second or less, and as low as about 0.05 second or less due to a small volume of the reaction zone 864. Pulses of a reducing gas, such as diborane, may be provided from gas source 839 at a flow rate between about 1 sccm and about 1,000 sccm, preferably between 10 sccm and about 500 sccm, more preferably from about 100 sccm to about 300 sccm through valve 842B for a pulse time of about 2 seconds or less, about 1 second or less, or about 0.1 second or less due to a smaller volume of the reaction zone 864. An argon purge gas at a flow rate between about 500 sccm and about 5,000 sccm, preferably, between about 1,500 sccm and about 3,500 sccm, may be continuously provided or pulsed from gas source 840 through valves 842A, 842B. The time between pulses of $Cp_2Ru$ and diborane may be about 0.5 second or less, such as about 0.1 second or less, and as low as about 0.07 second or less due to the smaller volume of the reaction zone 864. It is believed to fill a reaction zone with a reactant gas and/or purge gas, pulse times as low as about 0.016 second are sufficient, with correspondingly shorter pulse times for a reaction zone 864 sized for smaller wafers (e.g., 200 mm). The heater temperature is maintained in a range from about 100° C. to about 800° C., preferably from about 200° C. to about 600° C. The chamber pressure is maintained in a range from about 0.1 Torr to about 20 Torr, preferably from about 1.0 Torr to about 10 Torr, for example, about 1.5 Torr. This process forms a ruthenium layer at a rate in a range from about 0.1 Å to about 1.0 Å per ALD cycle. The alternating sequence may be repeated until a desired thickness is achieved.

The ruthenium layer is deposited to a sidewall coverage with a thickness of about 1,000 Å or less, generally in a range from about 1 Å to about 500 Å. In one example, the ruthenium layer is deposited to a sidewall coverage with a thickness of about 50 Å or less, preferably about 20 Å or less, and more preferably about 10 Å or less. A ruthenium layer with a thickness of about 10 Å or less is believed to be a sufficient thickness in the application as an underlayer to adhere tungsten deposition (i.e., tungsten nucleation layer) and prevent peeling of tungsten layers.

Embodiments of the invention include improved methodologies overcoming disadvantages of the prior art, and preferred precursors and chemistries providing additional advantages, such as higher conductance for deposited ruthenium layers and strong adhesion properties. Ruthenium layers may be formed with a sheet resistance less than about 2,000 Ω/sq, preferably less than about 1,000 Ω/sq, and more preferably less than about 500 Ω/sq. For example, ALD processes conducted at a temperature within the range from about 300° C. to about 350° C. form ruthenium layers with a sheet resistance measuring from about 25 Ω/sq to about 250 Ω/sq. In another example, a ruthenium layer with a thickness of about 100 Å may have a resistivity less than 15 μΩ-cm.

Tungsten Nucleation Layer Formation

Figure 2C:
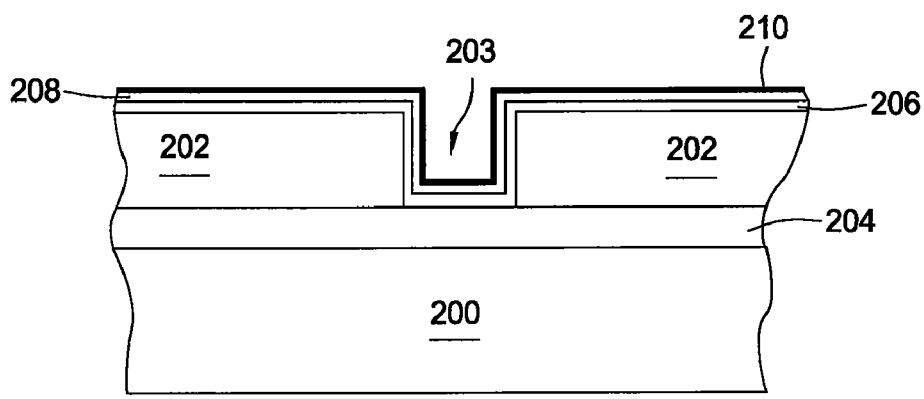

Process 100 further includes step 106 to expose the ruthenium layer 208 to a pre-soak process and step 108 to form a tungsten nucleation layer 210 on the ruthenium layer 208, as depicted in FIG. 2C. The tungsten nucleation layer 210 is deposited by using conventional deposition techniques, such as ALD, CVD or PVD. Preferably, tungsten nucleation layer 210 is deposited by an ALD process, such as alternately adsorbing a tungsten-containing precursor and a reducing compound. Tungsten nucleation layer 210 generally has a thickness ranging from about 10 Å to about 200 Å.

Figure 7:
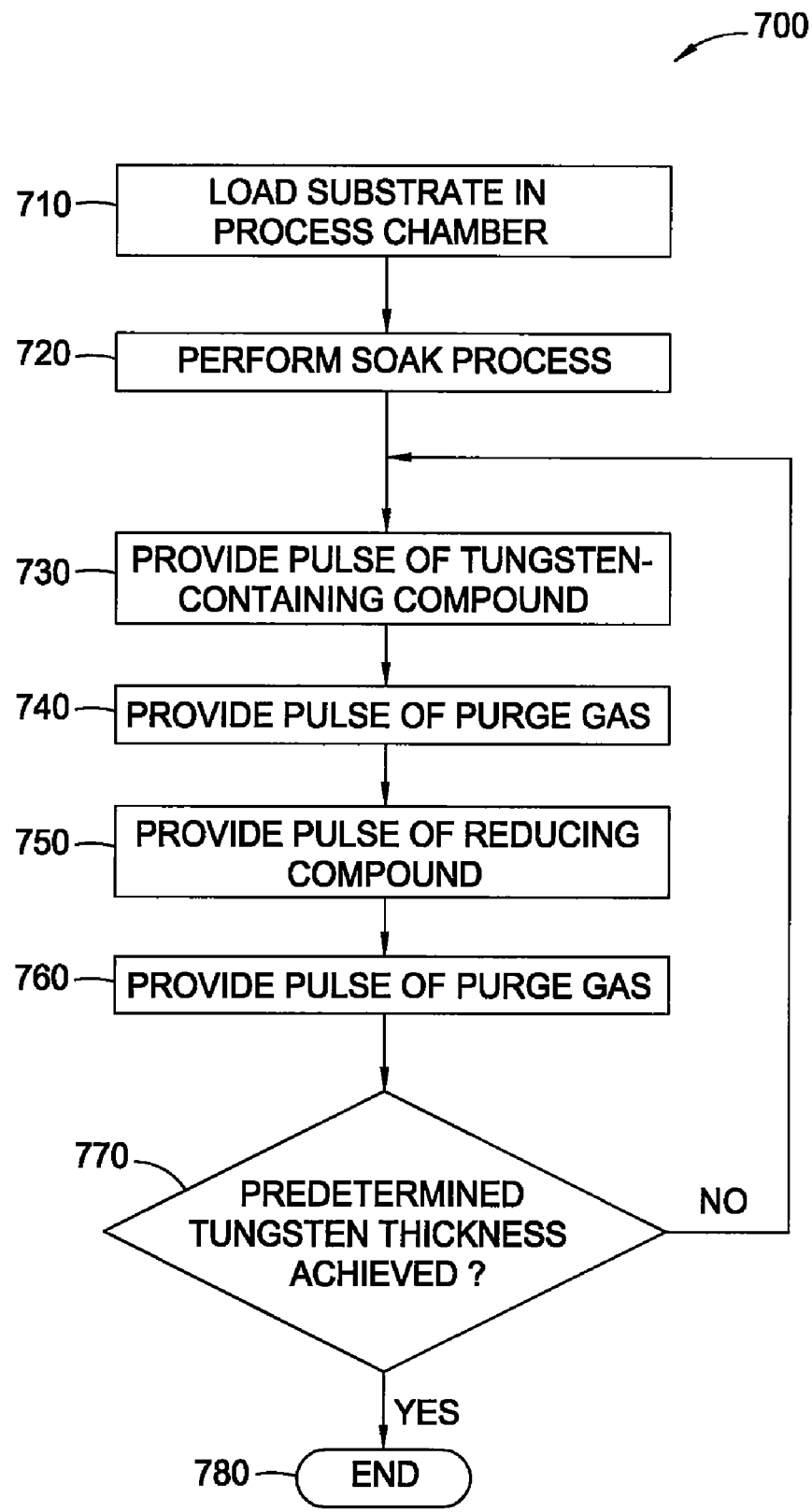
FIG. 7 illustrates a process sequence for tungsten-containing layer formation using deposition techniques according to one embodiment described herein.

FIG. 7 illustrates an exemplary process sequence 700 for forming an improved tungsten nucleation layer 210 according to one embodiment of the invention. A substrate, containing the exposed ruthenium layer, is first loaded into a process chamber capable of performing cyclical deposition and the process conditions are adjusted (step 710). The substrate is exposed to a soak process lasting in a range from about 5 seconds to about 90 seconds (step 720). A pulse of a tungsten-containing compound accompanied with a suitable carrier gas is introduced into the processing chamber (step 730). A pulse of purge gas is provided into the processing chamber (step 740) to purge or otherwise remove any residual tungsten-containing compound or by-products. Next, a pulse of a reducing compound accompanied with a suitable carrier gas is introduced into the processing chamber (step 750). The reducing compound may be the same compound as the gas used for the soak step (step 720) or alternatively, the reducing gas may be a different compound, depending on the product throughput requirements and the device applications. A pulse of gas is then introduced into the processing chamber (step 760) to purge or otherwise remove any residual reducing compound and/or by-products.

Embodiments of the invention provide an improved process for depositing tungsten films. The preferred process includes the pre-soak process at step 106 prior to tungsten nucleation layer 210 deposition to activate the underlying ruthenium layer 208. The pre-soak process includes exposing the substrate surface to a gas containing at least one reductant, such as hydrogen, borane, diborane, alkyboranes (e.g., ethylborane), silane, disilane, trisilane, alkyl silanes (e.g., methylsilane), halosilanes (e.g., dichlorosilane), derivatives thereof and combinations thereof. Preferably, the ruthenium layer 208 is exposed to diborane and/or silane. In general, the soak occurs in-situ in a range from about 5 seconds to about 90 seconds at similar processing conditions as a subsequent tungsten cyclical deposition process, thereby significantly increasing production throughput. Further description of a soak process and subsequent cyclic deposition process for tungsten are disclosed in commonly assigned U.S. patent application Ser. No. 10/418,728, filed Apr. 18, 2003, entitled, "Methods for Depositing Tungsten Layers Employing Atomic Layer Deposition Techniques," and is herein incorporated by reference. Suitable carrier gases or purge gases include helium, argon, nitrogen, hydrogen, forming gas and combinations thereof. Typically, the borane compounds utilize argon or nitrogen as a carrier gas and the silane compounds use hydrogen, argon or nitrogen as the carrier gas.

The substrate surface is exposed to a soak process at a temperature in the range from about 100° C. to about 600° C., preferably from about 100° C. to about 400° C., more preferably from about 300° C. to about 350° C. The soak process (step 720) is typically performed at a pressure in the range from about 1 Torr to about 150 Torr, preferably from about 5 Torr to about 90 Torr. In some examples, the pressure is in a range from about 5 Torr to about 20 Torr. In another example, the pressure is about 40 Torr. The soak is usually conducted to the substrate surface and exposed ruthenium layer for a period of time in the range from about 5 seconds to about 90 seconds. In one aspect, the soak will last for about 60 seconds or less. In another aspect, the soak will last for about 30 seconds or less. In another aspect, the soak will last for about 10 seconds. The soak process includes a soak compound and usually has a carrier gas. The flow rate of the soak compound is generally in the range from about 10 sccm to about 2,000 sccm, preferably from about 50 sccm to about 500 sccm. The flow rate of the carrier gas is generally in the range from about 10 sccm to about 2,000 sccm, preferably from about 50 sccm to about 500 sccm.

A soak process is administered to a substrate surface containing the exposed ruthenium layer 208. In one example, the soak process contains silane with a flow rate in the range from about 25 sccm to about 500 sccm and hydrogen with a flow rate in the range from about 200 sccm to about 700 sccm. The soak is conducted at a temperature in the range from about 100° C. to about 400° C., preferably about 300° C., a pressure in the range from about 1 Torr to about 120 Torr, preferably from about 30 Torr to about 120 Torr and for a period of time from about 5 seconds to about 90 seconds. In another example, the soak process contains diborane with a flow rate in the range from about 25 sccm to about 500 sccm and hydrogen and/or argon with a flow rate in the range from about 200 sccm to about 700 sccm. The soak is conducted at a temperature in the range from about 100° C. to about 400° C., preferably about 300° C., a pressure in the range from about 1 Torr to about 120 Torr, preferably from about 1 Torr to about 50 Torr, and for a period of time from about 5 seconds to about 90 seconds, preferably less than about 60 seconds.

The cyclical deposition process or ALD process of FIG. 7 typically occurs at a pressure in the range from about 1 Torr to about 150 Torr, preferably from about 5 Torr to about 90 Torr. In some examples, a pressure is in a range from about 5 Torr to about 20 Torr. In another example, the pressure is about 40 Torr. The temperature of the substrate can be as low as ambient temperature, about 20° C. However, the temperature is usually in the range from about 100° C. to about 600° C., preferably from about 100° C. to about 400° C., more preferably from about 300° C. to about 350° C. The temperature and pressure during the soak process may be independently maintained for the subsequent ALD process.

In step 730, the tungsten-containing compound is preferably tungsten hexafluoride and introduced at a rate in the range from about 5 sccm to about 200 sccm. The tungsten-containing compound can be introduced with a carrier gas, such as argon with a flow rate in the range from about 50 sccm to about 1,000 sccm. In step 750, the reducing compound is preferably diborane or silane and introduced at a rate in the range from about 5 sccm to about 2,000 sccm, preferably from about 50 sccm to about 500 sccm. The reducing compound can be introduced with a carrier gas, such as hydrogen, with a flow rate in the range from about 50 sccm to about 2,000 sccm. The pulses of a purge gas, preferably argon or nitrogen, at steps 740 and 760, are typically introduced at a rate from about 50 sccm to about 2,000 sccm, preferably about 500 sccm. Each processing step (steps 730 through 760) lasts from about 0.01 seconds to about 10 seconds, preferably from about 0.1 seconds to about 1 second. Longer processing steps, such as about 30 seconds or about 60 seconds, achieve tungsten deposition. However, the throughput is reduced. The specific pressures and times are obtained through experimentation. In one example, a 300 mm diameter wafer needs about twice the flow rate as a 200 mm diameter wafer in order to maintain similar throughput.

Referring to step 770, after each deposition cycle (steps 730 through 760), a tungsten nucleation layer 210 having a particular thickness will be deposited on the substrate surface. Usually, each deposition cycle forms a layer with a thickness in the range from about 1 Å to about 10 Å. Depending on specific device requirements, subsequent deposition cycles may be needed to deposit tungsten nucleation layer 210 having a desired thickness. As such, a deposition cycle (steps 730 through 760) can be repeated until the desired thickness for the tungsten nucleation layer 210 is achieved. The tungsten nucleation layer 210 is typically deposited to a thickness in the range from about 10 Å to about 200 Å, preferably from about 20 Å to about 100 Å. Thereafter, the process is stopped as indicated by step 780 when the desired thickness is achieved.

Suitable tungsten-containing compounds include tungsten hexafluoride ($WF_6$), tungsten hexachloride ($WCl_6$), tungsten hexacarbonyl ($W(CO)_6$), bis(cyclopentadienyl)tungsten dichloride ($Cp_2WCl_2$) and mesitylene tungsten tricarbonyl ($C_9H_{12}W(CO)_3$), as well as derivatives thereof. Suitable reducing compounds include silane compounds, borane compounds and hydrogen. Silane compounds include silane, disilane, trisilane, tetrasilane, chlorosilane, dichlorosilane, tetrachlorosilane, hexachlorodisilane, methylsilanes and other alkylsilanes and derivatives thereof, while borane compounds include borane, diborane, triborane, tetraborane, pentaborane, triethylborane and other alkylboranes and derivatives thereof. Preferred reducing compounds and soak compounds include silane, disilane, diborane, hydrogen and combinations thereof.

In FIG. 2C, tungsten nucleation layer 210 is then cyclically deposited on the ruthenium layer 208 following treatment of the substrate surface with a soak process. In one example, tungsten nucleation layer 210 is cyclically deposited using alternating pulses of tungsten hexafluoride and diborane. The tungsten hexafluoride is pulsed at a rate in a range from about 1 sccm to about 100 sccm, preferably from about 5 sccm to about 50 sccm for about 0.3 second. A carrier gas, such as argon, is provided along with the tungsten hexafluoride at a rate in a range from about 100 sccm to about 1,000 sccm, preferably from about 100 sccm to about 500 sccm. The diborane is pulsed at a rate in a range from about 50 sccm to about 1,000 sccm, preferably from about 400 sccm to about 600 sccm for about 0.3 second. A carrier gas, such as hydrogen, is provided along with the diborane at a rate in a range from about 50 sccm to about 500 sccm, preferably from about 100 sccm to about 300 sccm. The substrate is maintained at a temperature in a range from about 100° C. to about 400° C., preferably about 300° C., a chamber pressure in a range from about 1 Torr to about 120 Torr, preferably in a range from about 1 Torr to about 50 Torr. After each pulse of the tungsten hexafluoride and the diborane, argon is pulsed for about 0.5 second to purge or otherwise remove any reactive compounds from the processing chamber.

In another example, tungsten nucleation layer 210 is cyclically deposited on ruthenium layer 208 using alternating pulses of tungsten hexafluoride and silane. The tungsten hexafluoride is pulsed as described above with argon for about 0.5 seconds. The silane is pulsed at a rate in a range from about 1 sccm to about 100 sccm, preferably from about 5 sccm to about 50 sccm for about 0.5 second. A carrier gas, such as hydrogen, is provided along with the silane at a rate in a range from about 100 sccm to about 1,000 sccm, preferably from about 100 sccm to about 500 sccm. The substrate is maintained at a temperature in a range from about 100° C. to about 400° C., preferably about 300° C., a chamber pressure in a range from about 1 Torr to about 30 Torr, preferably in a range from about 5 Torr to about 20 Torr. After each pulse of the tungsten hexafluoride and the silane, argon is pulsed for about 0.5 second to purge or otherwise remove any reactive compounds from the processing chamber.

Tungsten nucleation layer formed by alternating pulses of tungsten hexafluoride and a reducing compound with a soak treatment has advantages over a nucleation layer formed by alternating pulses of tungsten hexafluoride and the same reducing compound without the prior soak. The tungsten nucleation layer shows less stress for the integrated film, as well as, less fluorine content at the interface of the nucleation layer (when $WF_6$ is used). Also, the nucleation layer deposited post a soak treatment has higher uniformity coverage and is deposited quicker due to a reduced incubation period. Fewer volcanoes appear on the surface of the tungsten film deposited utilizing a soak, as compared to tungsten films deposited without exploiting a soak after post tungsten bulk-fill deposition.

Tungsten Bulk Layer Formation

A soak process may be optionally administered to a substrate surface containing the tungsten nucleation layer 210. The soak process has been found to increase adhesion at the interface between the tungsten nucleation layer 210 and the tungsten bulk layer 212, as well as reduce electrical resistivity at the interface. The soak process usually includes a reductant, such as a silane compound or a borane compound, along with at least one carrier gas. Examples of reductants useful in a soak process include hydrogen, borane, diborane, alkyboranes (e.g., ethylborane), silane, disilane, trisilane, alkyl silanes (e.g., methylsilane), halosilanes (e.g., dichlorosilane), derivatives thereof and combinations thereof. Preferred reductants include silane and diborane while a preferred carrier gas is either hydrogen and/or argon.

In one example of a soak process, the substrate is exposed to a soak gas containing silane with a flow rate in the range from about 25 sccm to about 500 sccm and hydrogen with a flow rate in the range from about 200 sccm to about 700 sccm. The soak process is conducted at a temperature in the range from about 100° C. to about 400° C., preferably about 300° C., a pressure in the range from about 1 Torr to about 120 Torr, preferably about 30 Torr to about 120 Torr and for a period of time from about 5 seconds to about 90 seconds. In another example of a soak process, the substrate is exposed to a soak gas containing diborane with a flow rate in the range from about 25 sccm to about 500 sccm and hydrogen and/or argon with a flow rate in the range from about 200 sccm to about 700 sccm. The soak process is conducted at a temperature in the range from about 100° C. to about 400° C., preferably about 300° C., a pressure in the range from about 1 Torr to about 120 Torr, preferably about 1 Torr to about 50 Torr, and for a period of time from about 5 seconds to about 90 seconds, preferably less than about 60 seconds.

Figure 2D:
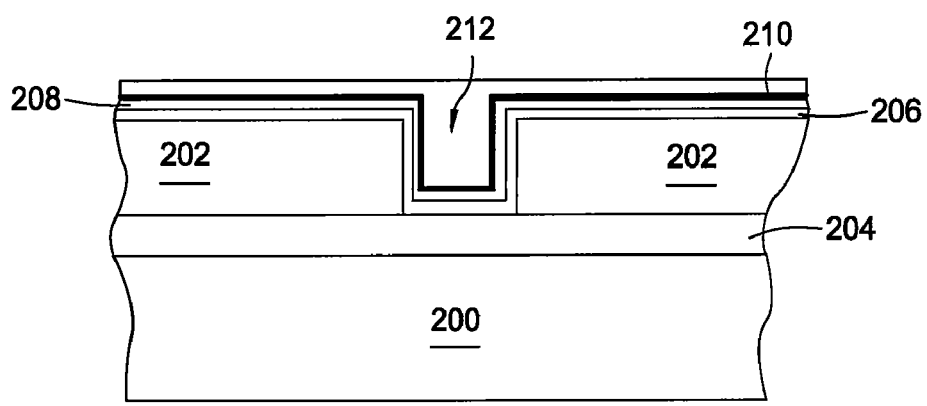

Process 100, of FIG. 1, further includes step 110, wherein a tungsten bulk layer 212 is formed on the tungsten nucleation layer 210, as depicted in FIG. 2D. Although any metal deposition process, such as conventional CVD or PVD, may be used, the tungsten bulk layer 212 may also be deposited by alternately adsorbing a tungsten-containing compound and a reducing compound as described above. Preferably, tungsten bulk layer 212 is deposited by a CVD process. Tungsten bulk layer 212 generally has a thickness in the range from about 100 Å to about 10,000 Å, preferably in the range from about 1,000 Å to about 5,000 Å. A more detailed description of tungsten deposition using a conventional CVD process or an ALD process followed by a CVD process may be found in commonly assigned U.S. Pat. Nos. 6,099,904, 6,156,382, and 6,551,929, which are all incorporated herein by reference.

Following deposition, the top portion of the resulting structure may be planarized. A chemical mechanical polishing (CMP) apparatus may be used, such as the MIRRA® System available from Applied Materials, Inc., Santa Clara, Calif. Portions of the tungsten bulk layer 212 are removed from the top of the structure leaving a fully planar surface. Optionally, the intermediate surfaces of the structure may be planarized between the depositions of the subsequent layers described above.

Hardware

FIG. 8 is a schematic cross-sectional view of one embodiment of a process chamber 780 including a gas delivery apparatus 830 adapted for cyclic deposition, such as ALD. Chamber 780 and other chambers capable of performing ALD performing ALD processes, may be used during processes 300, 400, 500, 600 and 700, as described above. A detailed description for a process chamber 780 is described in commonly assigned U.S. Pat. No. 6,916,398, and commonly assigned U.S. Ser. No. 10/281,079, filed Oct. 25, 2002, and published as US 2003-0121608, which are both incorporated herein in their entirety by reference. The terms atomic layer deposition (ALD) and rapid chemical vapor deposition as used herein refer to the sequential introduction of reactants to deposit a thin layer over a substrate structure. The sequential introduction of reactants may be repeated to deposit a plurality of thin layers to form a conformal layer to a desired thickness. The process chamber 780 may also be adapted for other deposition techniques.

The process chamber 780 comprises a chamber body 782 having sidewalls 784 and a bottom 786. A slit valve 788 in the process chamber 780 provides access for a robot (not shown) to deliver and retrieve a substrate 790, such as a semiconductor wafer with a diameter of 200 mm or 300 mm or a glass substrate, from the process chamber 780.

A substrate support 792 supports the substrate 790 on a substrate receiving surface 791 in the process chamber 780. The substrate support 792 is mounted to a lift motor 814 to raise and lower the substrate support 792 and a substrate 790 disposed thereon. A lift plate 816 connected to a lift motor 818 is mounted in the process chamber 780 and raises and lowers pins 820 movably disposed through the substrate support 792. The pins 820 raise and lower the substrate 790 over the surface of the substrate support 792. The substrate support 792 may include a vacuum chuck, an electrostatic chuck, or a clamp ring for securing the substrate 790 to the substrate support 792 during processing.

The substrate support 792 may be heated to increase the temperature of a substrate 790 disposed thereon. For example, the substrate support 792 may be heated using an embedded heating element, such as a resistive heater, or may be heated using radiant heat, such as heating lamps disposed above the substrate support 792. A purge ring 822 may be disposed on the substrate support 792 to define a purge channel 824 which provides a purge gas to a peripheral portion of the substrate 790 to prevent deposition thereon.

A gas delivery apparatus 830 is disposed at an upper portion of the chamber body 782 to provide a gas, such as a process gas and/or a purge gas, to the chamber 780. A vacuum system 878 is in communication with a pumping channel 879 to evacuate any desired gases from the process chamber 780 and to help maintain a desired pressure or a desired pressure range inside a pumping zone 866 of the process chamber 780.

In one embodiment, the process chamber depicted by FIG. 8 permits the process gas and/or purge gas to enter the process chamber 780 normal (i.e., 900) with respect to the plane of the substrate 790 via the gas delivery apparatus 830. Therefore, the surface of substrate 790 is symmetrically exposed to gases that allow uniform film formation on substrates. The process gas includes a first reagent during one pulse and includes a second reagent in another pulse.

Process chamber 780, depicted in FIG. 8, produces a uniform film and employs a short cycle time (as quick as tenths of a second pulse) to purge and short time to dose the wafer to saturation with precursors. The short dosing time is important in process 500 and 600 because many of the ruthenium-containing compounds have the inherent characteristic of a low vapor pressure. The low vapor pressure correlates to less precursor saturating the carrier gas per time and temperature, therefore, more time is needed to saturate the surface of the wafer with ruthenium-containing precursor (e.g., bis(2,4-dimethylpentadienyl)ruthenium) than a traditional precursor with a higher vapor pressure (e.g., $TiCl_4$).

In one embodiment, the gas delivery apparatus 830 comprises a chamber lid 832 and a lid cap 872. The chamber lid 832 and the lid cap 872 include an expanding channel 834 extending from a central portion of the chamber lid 832 and a bottom surface 860 extending from the expanding channel 834 to a peripheral portion of the chamber lid 832. The bottom surface 860 is sized and shaped to substantially cover a substrate 790 disposed on the substrate support 792. The expanding channel 834 has gas inlets 836A, 836B to provide gas flows from two similar valves 842A, 842B. The gas flows from the valves 842A, 842B may be provided together and/or separately.

In one configuration, valve 842A and valve 842B are coupled to separate reactant gas sources but are preferably coupled to the same purge gas source. For example, valve 842A is coupled to reactant gas source 838 and valve 842B is coupled to reactant gas source 839, and both valves 842A, 842B are coupled to purge gas source 840. Each valve 842A, 842B includes a delivery line 843A, 843B having a valve seat assembly 844A, 844B and includes a purge line 845A, 845B having a valve seat assembly 846A, 846B. The delivery line 843A, 843B is in communication with the reactant gas source 838, 839 and is in communication with the gas inlet 836A, 836B of the expanding channel 834. The valve seat assembly 844A, 844B of the delivery line 843A, 843B controls the flow of the reactant gas from the reactant gas source 838, 839 to the expanding channel 834. The purge line 845A, 845B is in communication with the purge gas source 840 and intersects the delivery line 843A, 843B downstream of the valve seat assembly 844A, 844B of the delivery line 843A, 843B. The valve seat assembly 846A, 846B of the purge line 845A, 845B controls the flow of the purge gas from the purge gas source 840 to the delivery line 843A, 843B. If a carrier gas is used to deliver reactant gases from the reactant gas source 838, 839, preferably the same gas is used as a carrier gas and a purge gas (i.e., an argon gas used as a carrier gas and a purge gas).

Each valve seat assembly 844A, 844B, 846A, 846B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujiken and Veriflow. Examples of electrically actuated valves include electrically actuated valves available from Fujiken. Programmable logic controllers 848A, 848B may be coupled to the valves 842A, 842B to control actuation of the diaphragms of the valve seat assemblies 844A, 844B, 846A, 846B of the valves 842A, 842B. Pneumatically actuated valves may provide pulses of gases in time periods as low as about 0.020 second. Electrically actuated valves may provide pulses of gases in time periods as low as about 0.005 second. An electrically actuated valve typically requires the use of a driver coupled between the valve and the programmable logic controller.

Each valve 842A, 842B may be a zero dead volume valve to enable flushing of a reactant gas from the delivery line 843A, 843B when the valve seat assembly 844A, 844B of the valve is closed. For example, the purge line 845A, 845B may be positioned adjacent the valve seat assembly 844A, 844B of the delivery line 843A, 843B. When the valve seat assembly 844A, 144B is closed, the purge line 845A, 845B may provide a purge gas to flush the delivery line 843A, 843B. In the embodiment shown, the purge line 845A, 845B is positioned slightly spaced from the valve seat assembly 844A, 844B of the delivery line 843A, 843B so that a purge gas is not directly delivered into the valve seat assembly 844A, 844B when open. A zero dead volume valve as used herein is defined as a valve which has negligible dead volume (i.e., not necessary zero dead volume).

Each valve 842A, 842B may be adapted to provide a combined gas flow and/or separate gas flows of the reactant gas 838, 839 and the purge gas 840. In reference to valve 842A, one example of a combined gas flow of the reactant gas 838 and the purge gas 840 provided by valve 842A comprises a continuous flow of a purge gas from the purge gas source 840 through purge line 845A and pulses of a reactant gas from the reactant gas source 838 through delivery line 843A. The continuous flow of the purge gas may be provided by leaving diaphragm of the valve seat assembly 846A of the purge line 845A open. The pulses of the reactant gas from the reactant gas source 838 may be provided by opening and closing the diaphragm of the valve seat 844A of the delivery line 843A. In reference to valve 842A, one example of separate gas flows of the reactant gas 838 and the purge gas 840 provided by valve 842A comprises pulses of a purge gas from the purge gas source 840 through purge line 845A and pulses of a reactant gas from the reactant gas source 838 through delivery line 843A. The pulses of the purge gas may be provided by opening and closing the diaphragm of the valve seat assembly 846A of the purge line 845A open. The pulses of the reactant gas from the reactant gas source 838 may be provided by opening and closing the diaphragm valve seat 844A of the delivery line 843A.

The delivery lines 843A, 843B of the valves 842A, 842B may be coupled to the gas inlets 836A, 836B through gas conduits 850A, 850B. The gas conduits 850A, 850B may be integrated or may be separate from the valves 842A, 842B. In one aspect, the valves 842A, 842B are coupled in close proximity to the expanding channel 834 to reduce any unnecessary volume of the delivery line 843A, 843B and the gas conduits 850A, 850B between the valves 842A, 842B and the gas inlets 836A, 836B.

In FIG. 8, the expanding channel 834 comprises a channel which has an inner diameter which increases from an upper portion 837 of the lid cap 872 to a lower portion 835 of the expanding channel 834 adjacent the bottom surface 860 of the chamber lid 832.

In one specific embodiment, the inner diameter of the expanding channel 834 for a chamber adapted to process 200 mm diameter substrates is between about 0.2 inches (0.51 cm) and about 1.0 inches (2.54 cm), more preferably between about 0.3 inches (0.76 cm) and about 0.9 inches (2.29 cm) and more preferably between about 0.3 inches (0.76 cm) and about 0.5 inches (1.27 cm) at the upper portion 837 of the expanding channel 834 and between about 0.5 inches (1.27 cm) and about 3.0 inches (7.62 cm), preferably between about 0.75 inches (1.91 cm) and about 2.5 inches (6.35 cm) and more preferably between about 1.1 inches (2.79 cm) and about 2.0 inches (5.08 cm) at the lower portion 835 of the expanding channel 834.

In another specific embodiment, the inner diameter of the expanding channel 834 for a chamber adapted to process 300 mm diameter substrates is between about 0.2 inches (0.51 cm) and about 1.0 inches (2.54 cm), more preferably between about 0.3 inches (0.76 cm) and about 0.9 inches (2.29 cm) and more preferably between about 0.3 inches (0.76 cm) and about 0.5 inches (1.27 cm) at the upper portion 837 of the expanding channel 134 and between about 0.5 inches (1.27 cm) and about 3.0 inches (7.62 cm), preferably between about 0.75 inches (1.91 cm) and about 2.5 inches (6.35 cm) and more preferably between about 1.2 inches (3.05 cm) and about 2.2 inches (5.59 cm) at the lower portion 835 of the expanding channel 834 for a 300 mm substrate. In general, the above dimension apply to an expanding channel adapted to provide a total gas flow of between about 500 sccm and about 3,000 sccm.

In other specific embodiments, the dimension may be altered to accommodate a certain gas flow therethrough. In general, a larger gas flow will require a larger diameter expanding channel. In one embodiment, the expanding channel 834 may be shaped as a truncated cone (including shapes resembling a truncated cone). Whether a gas is provided toward the walls of the expanding channel 834 or directly downward towards the substrate, the velocity of the gas flow decreases as the gas flow travels through the expanding channel 834 due to the expansion of the gas. The reduction of the velocity of the gas flow helps reduce the likelihood the gas flow will blow off reactants absorbed on the surface of the substrate 790.

Not wishing to be bound by theory, it is believed that the diameter of the expanding channel 834, which is gradually increasing from the upper portion 837 to the lower portion 835 of the expanding channel, allows less of an adiabatic expansion of a gas through the expanding channel 834 which helps to control the temperature of the gas. For instance, a sudden adiabatic expansion of a gas delivered through the gas inlet 836A, 836B into the expanding channel 834 may result in a drop in the temperature of the gas which may cause condensation of the precursor vapor and formation of particles. On the other hand, a gradually expanding channel 834 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of the chamber lid 832). The gradually expanding channel may comprise one or more tapered inner surfaces, such as a tapered straight surface, a concave surface, a convex surface, or combinations thereof or may comprise sections of one or more tapered inner surfaces (i.e., a portion tapered and a portion non-tapered).

In one embodiment, the gas inlets 836A, 836B are located adjacent the upper portion 837 of the expanding channel 834. In other embodiments, one or more gas inlets may be located along the length of the expanding channel 834 between the upper portion 837 and the lower portion 835.

In FIG. 8, a control unit 880, such as a programmed personal computer, work station computer, or the like, may be coupled to the process chamber 780 to control processing conditions. For example, the control unit 880 may be configured to control flow of various process gases and purge gases from gas sources 838, 839, 840 through the valves 842A, 842B during different stages of a substrate process sequence. Illustratively, the control unit 880 comprises a central processing unit (CPU) 882, support circuitry 884, and memory 886 containing associated control software 883.

The control unit 880 may be one of any form of general purpose computer processor that can be used in an industrial setting for controlling various chambers and sub-processors. The CPU 882 may use any suitable memory 886, such as random access memory, read only memory, floppy disk drive, compact disc drive, hard disk, or any other form of digital storage, local or remote. Various support circuits may be coupled to the CPU 882 for supporting the process chamber 780. The control unit 880 may be coupled to another controller that is located adjacent individual chamber components, such as the programmable logic controllers 848A, 848B of the valves 842A and 842B. Bi-directional communications between the control unit 880 and various other components of the process chamber 780 are handled through numerous signal cables collectively referred to as signal buses 888, some of which are illustrated in FIG. 8. In addition to control of process gases and purge gases from gas sources 838, 839, 840 and from the programmable logic controllers 848A, 848B of the valves 842A, 842B, the control unit 880 may be configured to be responsible for automated control of other activities used in wafer processing, such as wafer transport, temperature control, chamber evacuation, among other activities, some of which are described elsewhere herein.

A tungsten nucleation layer as described above has shown particular utility when integrated with traditional bulk fill techniques to form features with excellent film properties. An integration scheme can include ALD or cyclical deposition nucleation with bulk fill CVD or PVD processes. Integrated processing systems capable of performing such an integration scheme include an Endura®, Endura SL®, Centura® and Producer® processing systems, each available from Applied Materials, Inc. located in Santa Clara, Calif. Any of these systems can be configured to include at least one ALD chamber for depositing the tungsten nucleation layer and at least one CVD chamber or PVD chamber for tungsten bulk fill.

Figure 9A:
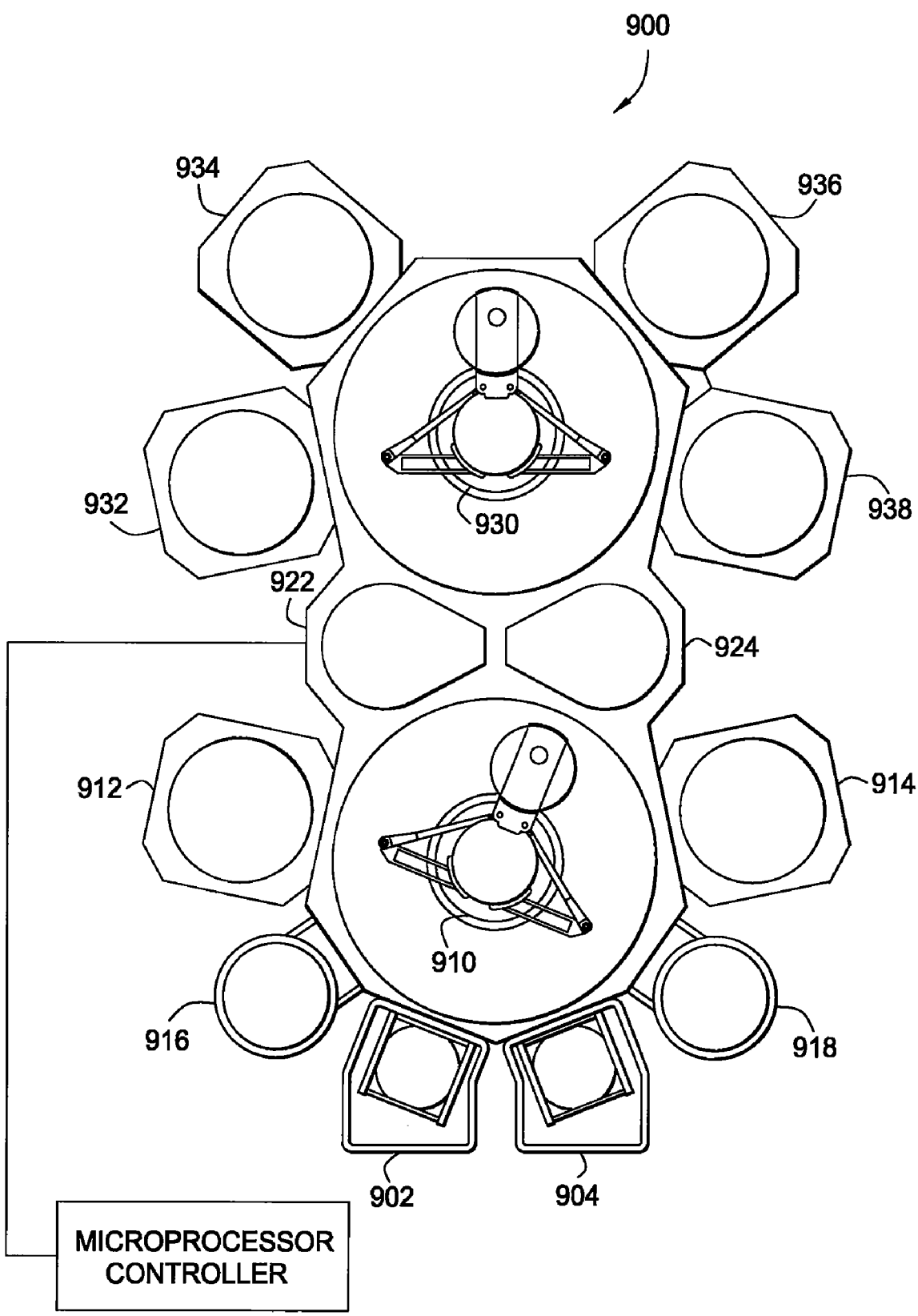
FIG. 9A depicts a schematic view of a process platform that may be used during processes described herein.

FIG. 9A is a schematic top-view diagram of an exemplary multi-chamber processing system 900. A similar multi-chamber processing system is disclosed in commonly assigned U.S. Pat. No. 5,186,718, which is incorporated by reference herein. The system 900 generally includes load lock chambers 902 and 904 for the transfer of substrates into and out from the system 900. Typically, since the system 900 is under vacuum, the load lock chambers 902 and 904 may "pump down" the substrates introduced into the system 900. A first robot 910 may transfer the substrates between the load lock chambers 902 and 904, and a first set of one or more substrate processing chambers 912, 914, 916 and 918 (four are shown). Each processing chamber 912, 914, 916 and 918, can be outfitted to perform a number of substrate processing operations such as ALD, CVD, PVD, etch, pre-clean, de-gas, orientation and other substrate processes. The first robot 910 also transfers substrates to/from one or more transfer chambers 922 and 924.

The transfer chambers 922 and 924 are used to maintain ultrahigh vacuum conditions while allowing substrates to be transferred within the system 900. A second robot 930 may transfer the substrates between the transfer chambers 922 and 924 and a second set of one or more processing chambers 932, 934, 936 and 938. Similar to processing chambers 912, 914, 916 and 918, the processing chambers 932, 934, 936 and 938 can be outfitted to perform a variety of substrate processing operations, such as ALD, CVD, PVD, etch, pre-clean, de-gas, and orientation, for example. Any of the substrate processing chambers 912, 914, 916, 918, 932, 934, 936 and 938 may be removed from the system 900 if not necessary for a particular process to be performed by the system 900.

In one arrangement of an embodiment, each processing chambers 916 and 918 may be an anneal chamber and each processing chambers 912 and 914 may be an ALD chamber, CVD chamber or PVD chamber adapted to deposit a barrier layer, such as tantalum nitride. Each processing chambers 932 and 938 may be an ALD chamber, CVD chamber or PVD chamber adapted to deposit a ruthenium layer on the barrier layer. Further, each processing chambers 934 and 936 may be an ALD chamber, CVD chamber, PVD chamber or combinations thereof adapted to deposit a tungsten nucleation layer and/or tungsten bulk layer on the ruthenium layer. Processing chambers 934 and 936 may be an ALD/CVD hybrid chamber, such as disclosed in commonly assigned U.S. Ser. No. 10/712,690, filed Nov. 13, 2003, and issued as U.S. Pat. No. 7,204,886, which is incorporated herein by reference. Another process chamber configured to operate in both an ALD mode as well as a conventional CVD mode is described in commonly assigned U.S. Ser. No. 10/016,300, filed on Dec. 12, 2001, and issued as U.S. Pat. No. 6,878,206, which is incorporated herein by reference. In a preferred embodiment, processing chambers 912 and 914 are each an ALD chamber or a PVD chamber, processing chambers 932, 934, 936 and 938 are each an ALD chamber.

In another arrangement of the embodiment, each processing chambers 916 and 918 may be an anneal chamber and each processing chambers 912 and 914 may be an ALD chamber, CVD chamber or PVD chamber adapted to deposit a ruthenium layer on a barrier layer, such as tantalum nitride. The barrier layer may be deposited on the substrate in a separate system (not shown). Each processing chambers 932 and 938 may be an ALD chamber adapted to deposit a tungsten nucleation layer. Each processing chamber 934 and 936 may be an ALD chamber, a CVD chamber or a PVD chamber adapted to form a tungsten bulk layer. In a preferred embodiment, processing chambers 912 and 914 are each an ALD chamber, processing chambers 932 and 938 are each an ALD chamber, and process chambers 934 and 936 are each a CVD chamber. Any one particular arrangement of the system 900 is provided to illustrate the invention and should not be used to limit the scope of the invention.

Figure 9B:
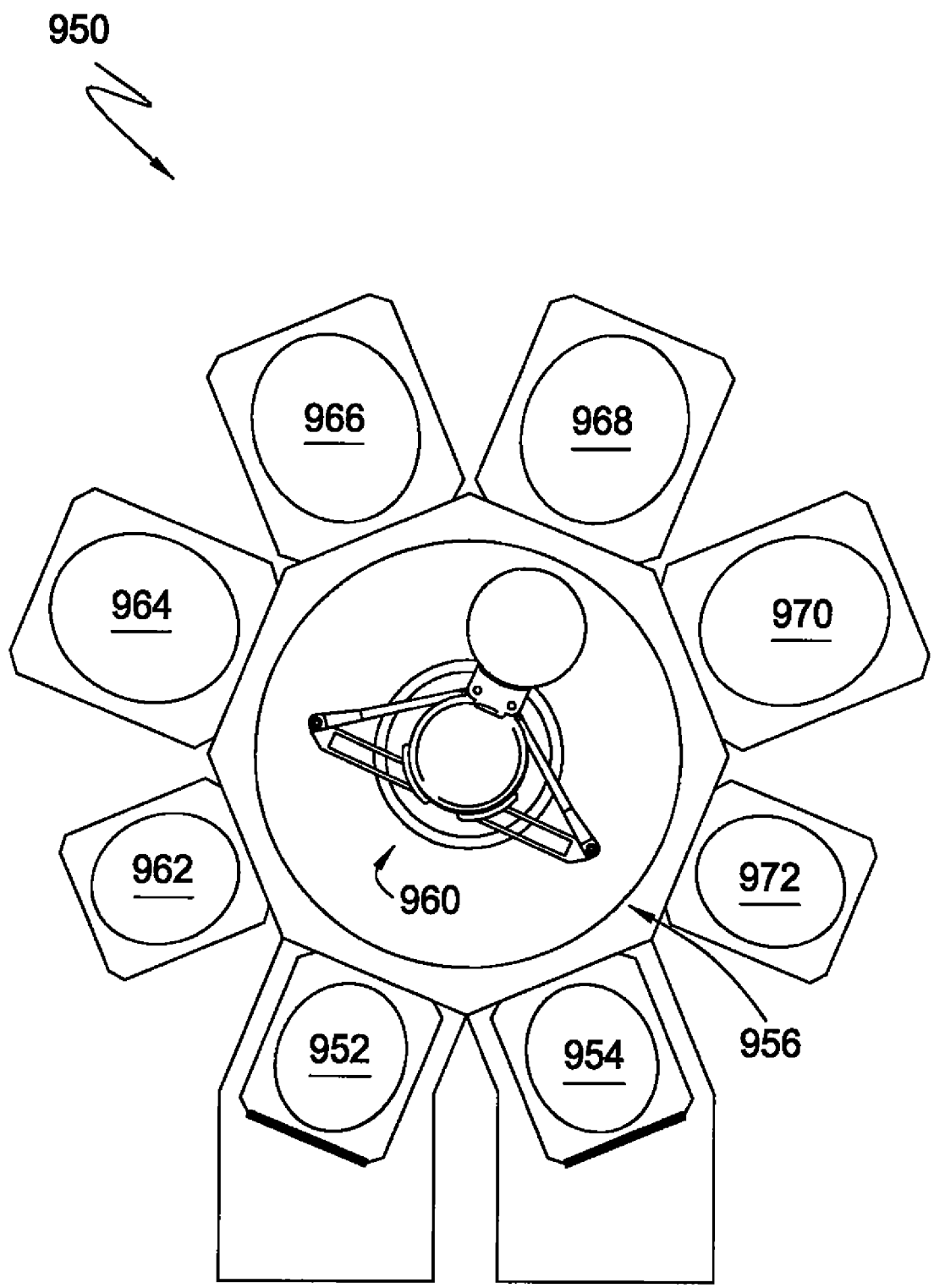
FIG. 9B depicts a schematic view of an alternate process platform that may be used during processes described herein.

FIG. 9B is a schematic top-view diagram of an exemplary multi-chamber processing system 950. The system 950 generally includes load lock chambers 952 and 954 for the transfer of substrates into and out from the system 950. Typically, since the system 950 is under vacuum, the load lock chambers 952 and 954 may "pump down" the substrates introduced into the system 950. A robot 960 may transfer the substrates between the load lock chambers 952 and 954, and substrate processing chambers 962, 964, 966, 968, 970 and 972. Each processing chamber 962, 964, 966, 968, 970 and 972 can be outfitted to perform a number of substrate processing operations such as ALD, CVD, PVD, etch, pre-clean, de-gas, heat, orientation and other substrate processes. The robot 960 also transfers substrates to/from a transfer chamber 956. Any of the substrate processing chambers 962, 964, 966, 968, 970 and 972 may be removed from the system 950 if not necessary for a particular process to be performed by the system 950.

In one arrangement of an embodiment, each processing chambers 964 and 970 may be an ALD chamber, CVD chamber or PVD chamber adapted to deposit a barrier layer, such as tantalum nitride and each processing chambers 966 and 968 may be an ALD chamber, a CVD chamber or a PVD chamber adapted to form ruthenium layer on the barrier layer. In another arrangement of an embodiment, each processing chambers 964 and 970 may be an ALD chamber adapted to deposit a tungsten nucleation layer and each processing chambers 966 and 968 may be an ALD chamber, a CVD chamber or a PVD chamber adapted to form a bulk tungsten layer. In one example, two systems are configured such that the first system deposits a barrier layer and a ruthenium layer and the second system deposits a tungsten nucleation layer and a tungsten bulk layer.

In another arrangement of the embodiment, each processing chambers 962 and 972 may be an anneal chamber and processing chamber 964 may be an ALD chamber, CVD chamber or PVD chamber adapted to deposit a barrier layer, such as tantalum nitride. Processing chamber 966 may be an ALD chamber, CVD chamber or PVD chamber adapted to deposit a ruthenium layer on the barrier layer. Processing chamber 968 may be an ALD chamber, a CVD chamber or a PVD chamber adapted to form tungsten nucleation layer on the ruthenium layer, while processing chamber 970 may be an ALD chamber, a CVD chamber or a PVD chamber adapted to form tungsten bulk layer on the tungsten nucleation layer.

Any one particular arrangement of the system 950 is provided to illustrate the invention and should not be used to limit the scope of the invention.

Hypothetical Experiments

Experiments in this section were conducted on substrates initially prepared by thermally growing a silicon dioxide layer with a thickness of 3,000 Å.

Experimental section for TaN-ALD: A barrier layer, such as a tantalum nitride layer, was deposited on the silicon dioxide layer by an ALD process. The tantalum nitride layer was deposited by sequential pulsing a tantalum precursor (e.g., PDMAT) and a nitrogen precursor (e.g., ammonia) into the process chamber. A substrate was placed in an ALD process chamber and exposed to an ALD cycle that included a pulse of PDMAT was 0.5 second, a pulse of purge gas (e.g., Ar) for 1.0 second, a pulse of ammonia for 0.5 second and a pulse of the purge gas for 1.0 second. The ALD cycle was repeated about 20 times to form a tantalum nitride layer with a thickness of 10 Å and with a sheet resistance greater than 20,000 Ω/sq.

Experimental section for Ru-ALD: The substrate was placed into a second ALD chamber equipped to deposit a ruthenium layer. The ruthenium layer was deposited on the tantalum nitride layer by sequentially exposing the substrate to a ruthenium precursor (e.g., $Cp_2Ru$) and a reagent (e.g., $B_2H_6$). During the precursor transfer, the chamber pressure was maintained at less than $5 \times 10^{-6}$ Torr and the substrate temperature at 350° C. The chamber spacing (distance between the wafer and the top of chamber body) was 230 mils. An ALD cycle included the following steps. Argon carrier gas containing the ruthenium precursor was exposed to the substrate for 4 seconds at a flow rate of 100 sccm. The chamber was purged with argon for 0.5 second at a flow rate of 2,000 sccm and then the substrate was exposed to the reagent for 1 second at a flow rate of 200 sccm. For the final step in the cycle, the chamber was purged with argon for 0.5 second at a flow rate of 2,000 sccm. The ALD process was yielded after the repetition of 100 cycles to form a ruthenium layer with a thickness of 50 Å.

W-deposition: Experimental section 1: A substrate containing the ruthenium layer deposited on the tantalum nitride barrier layer as described above was transferred into a third ALD process chamber. The substrate surface was exposed to a soak process by flowing 150 sccm $B_2H_6$ and 150 sccm $H_2$ at 5 Torr and 300° C. for about 10 seconds. Next, a tungsten nucleation layer was formed on the ruthenium layer by sequentially exposing the substrate to a tungsten precursor (e.g., $WF_6$) and a reductant (e.g., $B_2H_6$). The tungsten precursor was combined with a carrier gas (e.g., Ar) with a total flow rate of 320 sccm (i.e., 20 sccm $WF_6$ and 300 sccm Ar). The reductant was combined with a carrier gas (e.g., $H_2$) with a total flow rate of 300 sccm (i.e., 150 sccm $B_2H_6$ and 150 sccm $H_2$). The process chamber was maintained at 5 Torr and the substrate at 300° C. The ALD cycle included a pulse of the tungsten precursor for 0.2 second, a pulse of purge gas (e.g., Ar) for 0.5 second, a pulse of the reductant for 0.2 second and a pulse of the purge gas. The purge gas maintained a flow rate of 500 sccm. The ALD cycle was repeated until the nucleation layer had a thickness of about 50 Å. Subsequently, the substrate surface was exposed to a soak process by flowing 150 sccm $B_2H_6$ and 150 sccm $H_2$ at 5 Torr and 300° C. for about 10 seconds. Finally, a tungsten bulk layer was deposited on the nucleation layer using CVD to a thickness of about 2,500 Å.

W-deposition: Experimental section 2: A substrate containing the ruthenium layer deposited on the tantalum nitride barrier layer as described above was transferred into a third ALD process chamber. The substrate surface was exposed to a soak process by flowing 75 sccm $SiH_4$ and 500 sccm $H_2$ at 90 Torr and 350° C. for about 30 seconds. Next, a tungsten nucleation layer was formed on the ruthenium layer by sequentially exposing the substrate to a tungsten precursor (e.g., $WF_6$) and a reductant (e.g., $SiH_4$). The tungsten precursor was combined with a carrier gas (e.g., Ar) with a total flow rate of 330 sccm (i.e., 30 sccm $WF_6$ and 300 sccm Ar). The reductant was combined with a carrier gas (e.g., $H_2$) with a total flow rate of 320 sccm (i.e., 20 sccm $SiH_4$ and 300 sccm $H_2$). The process chamber was maintained at 5 Torr and the substrate at 300° C. The ALD cycle included a pulse of the tungsten precursor for 0.3 second, a pulse of purge gas (e.g., Ar) for 0.5 second, a pulse of the reductant for 0.3 second and a pulse of the purge gas. The purge gas maintained a flow rate of 500 sccm. The ALD cycle was repeated until the nucleation layer had a thickness of about 100 Å. Subsequently, the substrate surface was exposed to a soak process by flowing 150 sccm $B_2H_6$ and 150 sccm $H_2$ at 5 Torr and 300° C. for about 10 seconds. Finally, a tungsten bulk layer was deposited on the nucleation layer using CVD to a thickness of about 2,500 Å.

W-deposition: Experimental section 3: A substrate containing the ruthenium layer deposited on the tantalum nitride barrier layer as described above was transferred into a third ALD process chamber. The substrate surface was exposed to a soak process by flowing 75 sccm $SiH_4$ and 500 sccm $H_2$ at 90 Torr and 300° C. for about 60 seconds. Next, a tungsten nucleation layer was formed on the ruthenium-containing layer by sequentially exposing the substrate to a tungsten precursor (e.g., $WF_6$) and a reductant (e.g., $SiH_4$). The tungsten precursor was combined with a carrier gas (e.g., Ar) with a total flow rate of 320 sccm (i.e., 20 sccm $WF_6$ and 300 sccm Ar). The reductant was combined with a carrier gas (e.g., $H_2$) with a total flow rate of 315 sccm (i.e., 15 sccm $SiH_4$ and 300 sccm $H_2$). The process chamber was maintained at 20 Torr and the substrate at 300° C. The ALD cycle included a pulse of the tungsten precursor for 0.5 second, a pulse of purge gas (e.g., Ar) for 0.5 second, a pulse of the reductant for 0.5 second and a pulse of the purge gas. The purge gas maintained a flow rate of 500 sccm. The ALD cycle was repeated until the nucleation layer had a thickness of about 75 Å. Subsequently, the substrate surface was exposed to a soak process by flowing 75 sccm $SiH_4$ and 500 sccm $H_2$ at 90 Torr and 300° C. for about 60 seconds. Finally, a tungsten bulk layer was deposited on the nucleation layer using CVD to a thickness of about 2,500 Å.

W-deposition: Experimental section 4: A substrate containing the ruthenium layer deposited on the tantalum nitride barrier layer as described above was transferred into a third ALD process chamber. The substrate surface was exposed to a soak process by flowing 150 sccm $B_2H_6$ and 150 sccm $H_2$ at 15 Torr and 300° C. for about 10 seconds. Next, a tungsten nucleation layer was formed on the ruthenium-containing layer by sequentially exposing the substrate to a tungsten precursor (e.g., $WF_6$) and a reductant (e.g., $SiH_4$). The tungsten precursor was combined with a carrier gas (e.g., Ar) with a total flow rate of 320 sccm (i.e., 20 sccm $WF_6$ and 300 sccm Ar). The reductant was combined with a carrier gas (e.g., $H_2$) with a total flow rate of 315 sccm (i.e., 15 sccm $SiH_4$ and 300 sccm $H_2$). The process chamber was maintained at 15 Torr and the substrate at 300° C. The ALD cycle included a pulse of the tungsten precursor for 0.3 second, a pulse of purge gas (e.g., Ar) for 0.5 second, a pulse of the reductant for 0.3 second and a pulse of the purge gas. The purge gas maintained a flow rate of 500 sccm. The ALD cycle was repeated until the nucleation layer had a thickness of about 50 Å. Subsequently, the substrate surface was exposed to a soak process by flowing 75 sccm $SiH_4$ and 500 sccm $H_2$ at 90 Torr and 300° C. for about 60 seconds. Finally, a tungsten bulk layer was deposited on the nucleation layer using CVD to a thickness of about 2,500 Å.

W-deposition: Experimental section 5: A substrate containing the ruthenium layer deposited on the tantalum nitride barrier layer as described above was transferred into a third ALD process chamber. The substrate surface was exposed to a soak process by flowing 150 sccm $B_2H_6$ and 150 sccm $H_2$ at 15 Torr and 300° C. for about 10 seconds. Next, a tungsten nucleation layer was formed on the ruthenium-containing layer by sequentially exposing the substrate to a tungsten precursor (e.g., $WF_6$) and a reductant (e.g., $SiH_4$). The tungsten precursor was combined with a carrier gas (e.g., Ar) with a total flow rate of 320 sccm (i.e., 20 sccm $WF_6$ and 300 sccm Ar). The reductant was combined with a carrier gas (e.g., $H_2$) with a total flow rate of 315 sccm (i.e., 15 sccm $SiH_4$ and 300 sccm $H_2$). The process chamber was maintained at 15 Torr and the substrate at 300° C. The ALD cycle included a pulse of the tungsten precursor for 0.3 second, a pulse of purge gas (e.g., Ar) for 0.5 second, a pulse of the reductant for 0.3 second and a pulse of the purge gas. The purge gas maintained a flow rate of 500 sccm. The ALD cycle was repeated until the nucleation layer had a thickness of about 50 Å. Subsequently, the substrate surface was exposed to a soak process by flowing 25 sccm $B_2H_6$ and 500 sccm $H_2$ at 10 Torr and 300° C. for about 20 seconds. Finally, a tungsten bulk layer was deposited on the nucleation layer using CVD to a thickness of about 2,500 Å.

While foregoing is directed to the preferred embodiment of the present invention, other and further embodiments of the invention may be devised without departing from the basic scope thereof, and the scope thereof is determined by the claims that follow.

The invention claimed is:

1. A method for depositing materials on a substrate surface, comprising:
   depositing a barrier layer comprising tantalum or titanium on a substrate;
   depositing a ruthenium layer on the barrier layer; and
   depositing a tungsten bulk layer over the ruthenium layer.

2. The method of claim 1, wherein the barrier layer comprises tantalum nitride deposited by an atomic layer deposition process and the tungsten bulk layer is deposited by a chemical vapor deposition process.

3. The method of claim 1, wherein the ruthenium layer is deposited by exposing the substrate having the barrier layer to a ruthenium precursor during an atomic layer deposition process.

4. The method of claim 3, wherein the ruthenium precursor is selected from the group consisting of bis(cyclopentadienyl) ruthenium compounds, bis(alkylcyclopentadienyl) ruthenium compounds, bis(dialkylcyclopentadienyl) ruthenium compounds, bis(pentadienyl) ruthenium compounds, bis(alkylpentadienyl) ruthenium compounds, and bis(dialkylpentadienyl) ruthenium compounds.

5. The method of claim 4, further comprising exposing the substrate having the barrier layer to a reagent during the atomic layer deposition process, wherein the reagent is selected from the group consisting of hydrogen, silane, disilane, diborane, derivatives thereof, and combinations thereof.

6. The method of claim 3, wherein the ruthenium precursor is selected from the group consisting of bis(cyclopentadienyl) ruthenium, bis(methylcyclopentadienyl) ruthenium, bis(ethylcyclopentadienyl) ruthenium, bis(pentamethylcyclopentadienyl) ruthenium, bis(2,4-dimethylpentadienyl) ruthenium, bis(2,4-diethylpentadienyl) ruthenium, derivatives thereof, and combinations thereof.

7. The method of claim 3, further comprising exposing the ruthenium layer to a soak compound during a soak process prior to depositing the tungsten bulk layer.

8. The method of claim 7, wherein the ruthenium layer is exposed to the soak compound for a time period within a range from about 5 seconds to about 90 seconds during the soak process.

9. The method of claim 8, wherein the soak compound is selected from the group consisting of hydrogen, borane, diborane, silane, disilane, trisilane, derivatives thereof, and combinations thereof.

10. The method of claim 1, further comprising depositing a tungsten nucleation layer on the ruthenium layer prior to depositing the tungsten bulk layer thereto.

11. The method of claim 10, wherein the tungsten nucleation layer is deposited by sequentially exposing the substrate having the ruthenium layer to a tungsten precursor and a reducing gas during an atomic layer deposition process.

12. The method of claim 11, wherein the reducing gas comprises a reagent selected from the group consisting of hydrogen, silane, disilane, trisilane, borane, diborane, triethylborane, derivatives thereof, and combinations thereof.

13. The method of claim 12, wherein the tungsten precursor comprises tungsten hexafluoride and the reducing gas comprises silane or diborane.

14. The method of claim 10, further comprising exposing the tungsten nucleation layer to a soak compound during a soak process prior to depositing the tungsten bulk layer, wherein the soak compound is selected from the group consisting of hydrogen, borane, diborane, silane, disilane, trisilane, derivatives thereof, and combinations thereof.

15. A method for depositing materials on a substrate surface, comprising:
    depositing a barrier layer comprising tantalum or titanium on a substrate;
    depositing a cobalt layer on the barrier layer; and
    depositing a tungsten bulk layer over the cobalt layer.

16. The method of claim 15, wherein the barrier layer comprises tantalum nitride deposited by an atomic layer deposition process.

17. The method of claim 16, wherein the tungsten bulk layer is deposited by a chemical vapor deposition process.

18. The method of claim 15, wherein the cobalt layer is deposited by exposing the substrate having the barrier layer to a cobalt precursor during an atomic layer deposition process.

19. The method of claim 18, wherein the cobalt precursor is selected from the group consisting of bis(cyclopentadienyl) cobalt, (cyclopentadienyl) (cyclohexadienyl) cobalt, cyclopentadienyl (1,3-hexadienyl) cobalt, (cyclobutadienyl) (cyclopentadienyl) cobalt, bis(methylcyclopentadienyl) cobalt (cyclopentadienyl) (5-methylcyclopentadienyl) cobalt, bis (ethylene) (pentamethylcyclopentadienyl) cobalt, derivatives thereof.

20. The method of claim 18, further comprising exposing the cobalt layer to a soak compound during a soak process prior to depositing the tungsten bulk layer.

21. The method of claim 20, wherein the cobalt layer is exposed to the soak compound for a time period within a range from about 5 seconds to about 90 seconds during the soak process, and the soak compound is selected from the group consisting of hydrogen, borane, diborane, silane, disilane, trisilane, derivatives thereof, and combinations thereof.

22. The method of claim 15, further comprising depositing a tungsten nucleation layer on the cobalt layer prior to depositing the tungsten bulk layer thereto.

23. The method of claim 22, wherein the tungsten nucleation layer is deposited by an atomic layer deposition process.

24. The method of claim 22, further comprising exposing the tungsten nucleation layer to a soak compound during a soak process prior to depositing the tungsten bulk layer, wherein the soak compound is selected from the group consisting of hydrogen, borane, diborane, silane, disilane, trisilane, derivatives thereof, and combinations thereof.

25. A method for depositing materials on a substrate surface, comprising:

depositing a tantalum-containing barrier layer on a substrate;

depositing a noble metal layer comprising ruthenium or cobalt on the tantalum-containing barrier layer during an atomic layer deposition process;

exposing the noble metal layer to a soak compound during a soak process, the soak compound is selected from the group consisting of hydrogen, borane, diborane, silane, disilane, trisilane, derivatives thereof, and combinations thereof; and depositing a tungsten bulk layer over the noble metal layer.

\* \* \* \* \*

UNITED STATES PATENT AND TRADEMARK OFFICE
CERTIFICATE OF CORRECTION

PATENT NO. : 7,691,442 B2
APPLICATION NO. : 12/197049
DATED : April 6, 2010
INVENTOR(S) : Gandikota et al.

It is certified that error appears in the above-identified patent and that said Letters Patent is hereby corrected as shown below:

Column 11, Line 18, please delete "(2,4-diisopropyl pentadienyl)" and insert --(2,4-diisopropylpentadienyl)-- therefor;

Column 21, Line 48, please delete "(i.e., 900)" and insert --(i.e., 90°)-- therefor.

Signed and Sealed this

Twenty-ninth Day of June, 2010

David J. Kappos
*Director of the United States Patent and Trademark Office*